United States Patent
Tatemichi et al.

(10) Patent No.: US 10,424,637 B2
(45) Date of Patent: Sep. 24, 2019

(54) METHOD OF MANUFACTURING SEMICONDUCTOR DEVICE

(71) Applicant: FUJI ELECTRIC CO., LTD., Kawasaki-shi, Kanagawa (JP)

(72) Inventors: Shuhei Tatemichi, Matsumoto (JP); Shunji Takenoiri, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/232,371

(22) Filed: Dec. 26, 2018

(65) Prior Publication Data

US 2019/0131391 A1 May 2, 2019

Related U.S. Application Data

(62) Division of application No. 15/637,194, filed on Jun. 29, 2017, now Pat. No. 10,177,219.

(30) Foreign Application Priority Data

Aug. 23, 2016 (JP) .................................. 2016-163158

(51) Int. Cl.
*H01L 21/265* (2006.01)
*H01L 29/06* (2006.01)
(Continued)

(52) U.S. Cl.
CPC ........ *H01L 29/0634* (2013.01); *H01L 21/265* (2013.01); *H01L 21/26506* (2013.01);
(Continued)

(58) Field of Classification Search
CPC . H01L 21/265–26506; H01L 21/26533; H01L 21/3221; H01L 29/0634
See application file for complete search history.

(56) References Cited

U.S. PATENT DOCUMENTS

2002/0005549 A1\* 1/2002 Saito ................. H01L 21/26533
257/328
2013/0240951 A1 9/2013 Bedell et al.
2014/0306283 A1\* 10/2014 Nakajima ........... H01L 29/7827
257/329

FOREIGN PATENT DOCUMENTS

JP 2006-294772 A 10/2006
JP 2007-311547 A 11/2007

\* cited by examiner

*Primary Examiner* — Daniel P Shook

(74) *Attorney, Agent, or Firm* — Rabin & Berdo, P.C.

(57) ABSTRACT

A method of manufacturing a semiconductor device that includes a semiconductor layer of a first conductivity type, and a parallel pn layer formed on the semiconductor layer, the pn layer having first semiconductor regions of the first conductivity type and second semiconductor regions of a second conductivity type, the first and second regions being alternately arranged parallel to a surface of the semiconductor layer. In one embodiment, the method includes repeatedly performing the following steps to stack the epitaxial growth layers on the semiconductor layer to form the pn layer: forming an epitaxial growth layer of the first conductivity type or non-doped, the epitaxial growth layer having an impurity concentration lower than that of the semiconductor layer, ion implanting a first-conductivity-type impurity into the epitaxial growth layer, selectively ion implanting a second-conductivity-type impurity into the epitaxial growth layer and ion implanting a group 18 element into the epitaxial growth layer.

20 Claims, 26 Drawing Sheets

(51) Int. Cl.
*H01L 29/78* (2006.01)
*H01L 29/32* (2006.01)
H01L 29/66 (2006.01)
H01L 29/739 (2006.01)

(52) U.S. Cl.
CPC .......... *H01L 29/0696* (2013.01); *H01L 29/32* (2013.01); *H01L 29/7802* (2013.01); *H01L 29/66333* (2013.01); *H01L 29/7395* (2013.01)

METHOD OF MANUFACTURING SEMICONDUCTOR DEVICE

CROSS REFERENCE TO RELATED APPLICATIONS

This is a divisional application of U.S. application Ser. No. 15/637,194, filed on Jun. 29, 2017, and allowed on Sep. 6, 2018, and is based upon and claims the benefit of priority of the prior Japanese Patent Application No. 2016-163158, filed on Aug. 23, 2016, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

A conventionally known superjunction (SJ) semiconductor device has a drift layer that is a parallel pn layer formed by alternately arranging an n-type region and a p-type region of an increased impurity concentration, repeatedly in a direction parallel to a substrate main surface (hereinafter referred to as a lateral direction). A conventional superjunction semiconductor device will be described by taking, for example, a superjunction metal oxide semiconductor field effect transistor (MOSFET) (e.g., an insulated gate field effect transistor) as an example. FIG. 40 is a cross-sectional view of a structure of a conventional superjunction semiconductor device.

As depicted in FIG. 40, the conventional superjunction semiconductor device includes a parallel pn layer 105 formed by alternately arranging an n-type region 103 and a p-type region 104, repeatedly in the lateral direction. The parallel pn layer 105 is provided via an n$^-$-type buffer layer 102 on a front surface of an n$^+$-type semiconductor substrate 101 forming an n$^+$-type drain layer. A general MOS (metal oxide semiconductor) gate structure made up of a p-type base region 106, an n$^+$-type source region 107, a gate insulating film 108, and a gate electrode 109 is provided on a first side of the parallel pn layer 105 opposite a second side of the parallel pn layer 105, the second side facing the n$^+$-type semiconductor substrate 101.

To achieve a low ON resistance while ensuring a predetermined breakdown voltage in this superjunction semiconductor device, the total impurity amounts of the n-type region 103 and the p-type region 104 of the parallel pn layer 105 must be made substantially the same, and the impurity concentration in the depth direction must be made substantially uniform in each of the regions. For example, when the n-type region 103 and the p-type region 104 of the parallel pn layer 105 have the same widths w101, w102 and the impurity concentration is made substantially the same between the n-type region 103 and the p-type region 104, the total impurity amounts of both regions can be made substantially the same. Reference numeral 111 denotes an interlayer insulating film.

However, since the operating resistance when avalanche breakdown occurs is a negative resistance in the conventional superjunction semiconductor device, local concentration of rapidly increasing current when avalanche breakdown occurs (hereinafter referred to as an avalanche current) easily occurs, and it is difficult to ensure a sufficient avalanche resistance (breakdown resistance). For example, when the superjunction semiconductor device is turned off, the potential distribution of the parallel pn layer 105 causes holes (positive holes) generated by avalanche breakdown to pass through the p-type region 104 of the parallel pn layer 105 to a source electrode 112 and electrons to pass through the n-type region 103 of the parallel pn layer 105 to a drain electrode 113.

Therefore, if the impurity concentration in the depth direction is made substantially uniform between the n-type region 103 and the p-type region 104 so as to achieve a low ON resistance while ensuring a predetermined breakdown voltage as described above, the time necessary for the holes to pass through the p-type region 104 to the source electrode 112 is longer than the time required for the electrons to pass through the n-type region 103 to the drain electrode 113 when avalanche breakdown occurs because of a difference in mobility between the holes and the electrons. Therefore, when avalanche breakdown occurs, the charge balance of the parallel pn layer 105 is lost and the operating resistance becomes negative. As a result, the local concentration of the avalanche current easily occurs.

In a method proposed as a method of preventing a reduction in breakdown voltage, a gettering source is formed to take in a crystal defect in a silicon substrate (Si chip) and the gettering source is then removed to remove the crystal defect causing a reduction in breakdown voltage (see, e.g., Japanese Laid-Open Patent Publication No. 2006-294772 (paragraphs 0010 to 0012, FIG. 7)). In Japanese Laid-Open Patent Publication No. 2006-294772, ion implantation of argon (Ar) is performed at a dose amount of $1\times10^{15}/cm^2$ and an accelerating voltage of 100 keV so as to form a crystal strain layer serving as a gettering source.

In a method proposed as a method of improving the reliability, ion implantation of argon is performed at a dose amount of about $5\times10^{15}/cm^2$ into a portion of a silicon substrate exposed at a gate trench bottom in a trench gate type MOSFET so as to increase an oxidation rate in a portion of a gate insulating film at the trench bottom (see, e.g., Japanese Laid-Open Patent Publication No. 2007-311547 (paragraph 0016, FIG. 4)). In Japanese Laid-Open Patent Publication No. 2007-311547, the reliability of the gate insulating film is improved by thickening a portion of the gate insulating film at the gate trench bottom where drain operating voltage concentrates.

SUMMARY OF THE INVENTION

According to one aspect of the present invention, a semiconductor device includes a parallel pn layer formed on a first main surface of a semiconductor layer of a first conductivity type, where the parallel pn layer includes a first semiconductor region of the first conductivity type and a second semiconductor region of a second conductivity type, and the first and second semiconductor regions alternatingly arranged in a direction parallel to a surface of the semiconductor layer, repeatedly. The semiconductor device further includes a first region in which a group 18 element is introduced in the second semiconductor region.

In the semiconductor device, the first region is one of plural first regions arranged at a predetermined first interval in a depth direction from the first main surface to a second main surface of the semiconductor layer.

In the semiconductor device, the first region is included only in the second semiconductor region.

In the semiconductor device, the first region is provided in the second semiconductor region.

The semiconductor device includes a second region in which a group 18 element is introduced in the first semiconductor region. The second region is one of plural second regions arranged at a predetermined second interval in the depth direction.

In the semiconductor device, the second region is provided in the first semiconductor region.

In the semiconductor device, the second interval is wider than the first interval.

In the semiconductor device, the second interval is equal to the first interval.

In the semiconductor device, one or more of the first regions extend in a direction parallel to a surface of the semiconductor layer and reach a boundary between the second semiconductor region and the first semiconductor region.

In the semiconductor device, the one or more of the first regions extend in a direction parallel to a surface of the semiconductor layer from the second semiconductor region across the first semiconductor region.

In the semiconductor device, the first regions are formed only in the second semiconductor region, and the second regions extend from the first semiconductor region across the second semiconductor region in a direction parallel to a surface of the first semiconductor region such that the first regions and the second regions are alternately arranged in the depth direction, repeatedly.

The semiconductor device further includes a low-concentration semiconductor layer of the first conductivity type having an impurity concentration lower than the first semiconductor region, provided between the semiconductor layer and the first semiconductor region.

In the semiconductor device, the group 18 element is argon.

According to another aspect of the present invention, a method of manufacturing a semiconductor device having a parallel pn layer on a semiconductor layer of a first conductivity type, the parallel pn layer having a first semiconductor region of the first conductivity type and a second semiconductor region of a second conductivity type, the first and second semiconductor regions alternately arranged in a direction parallel to a surface of the semiconductor layer, repeatedly, includes repeatedly executing a set of processes including: a depositing process of forming an epitaxial growth layer of the first conductivity type or non-doped, the epitaxial growth layer having an impurity concentration that is lower than an impurity concentration of the semiconductor layer; a first implanting process of ion implanting a first-conductivity-type impurity into the epitaxial growth layer; a second implanting process of selectively ion implanting a second-conductivity-type impurity into the epitaxial growth layer; and a third implanting process of ion implanting a group 18 element into the epitaxial growth layer. The set of processes is repeatedly executed so as to stack on the semiconductor layer, the epitaxial growth layer forming the parallel pn layer.

In the method, the third implanting process includes ion implanting the group 18 element into the epitaxial growth layer only at a position at which the second-conductivity-type impurity is ion implanted.

In the method, the second implanting process includes: forming on a surface of the epitaxial growth layer, a first mask having an opening at a portion corresponding to a formation region of the second semiconductor region, and ion implanting the second-conductivity-type impurity through the first mask. The third implanting process includes ion implanting the group 18 element through the first mask.

The method further includes a fourth implanting process of ion implanting the group 18 element into the epitaxial growth layer only at a second position at which the first-conductivity-type impurity is ion implanted. The fourth implanting process is executed each time the set of processes is repeated or at intervals of a predetermined number of times of repetition of the set of processes.

In the method, the third implanting process includes at intervals of a predetermined number of times of repetition of the set of processes, ion implanting the group 18 element into the epitaxial growth layer only at a position at which the second-conductivity-type impurity is ion implanted.

According to another aspect of the present invention, a method of manufacturing a semiconductor device having a parallel pn layer on a semiconductor layer of a first conductivity type, the parallel pn layer having a first semiconductor region of the first conductivity type and a second semiconductor region of a second conductivity type, the first and second semiconductor regions alternately arranged in a direction parallel to a surface of the semiconductor layer, repeatedly, includes repeatedly executing a set of processes including: a depositing process of forming an epitaxial growth layer of the first conductivity type or non-doped, the epitaxial growth layer having an impurity concentration that is lower than an impurity concentration of the semiconductor layer; a first implanting process of ion implanting a first-conductivity-type impurity into the epitaxial growth layer; and a second implanting process of selectively ion implanting a second-conductivity-type impurity into the epitaxial growth layer. The set of processes is repeatedly executed so as to stack on the semiconductor layer, the epitaxial growth layer forming the parallel pn layer. The method further includes a third implanting process of ion implanting a group 18 element into the epitaxial growth layer executed at intervals of a predetermined number of times of repetition of the set of processes.

In the method, the third implanting process includes ion implanting the group 18 element into the epitaxial growth layer only at a first position at which the second-conductivity-type impurity is ion implanted. The method further includes a fourth implanting process of ion implanting the group 18 element into the epitaxial growth layer only at a second position which the first-conductivity-type impurity is ion implanted, the fourth implanting process executed at intervals of a predetermined number of times of repetition of the set of processes.

In the method, the first implanting process includes: forming on a surface of the epitaxial growth layer, a second mask having an opening at a portion corresponding to a formation region of the first semiconductor region, and ion implanting the first-conductivity-type impurity through the second mask. The fourth implanting process includes ion implanting the group 18 element through the second mask.

In the method, the third implanting process is executed after the first implanting process and the second implanting process.

In the method, the third implanting process is executed after the second implanting process.

In the method, the fourth implanting process is executed after the first implanting process.

According to another aspect of the present invention, a method of manufacturing a semiconductor device having a parallel pn layer on a semiconductor layer of a first conductivity type, the parallel pn layer having a first semiconductor region of the first conductivity type and a second semiconductor region of a second conductivity type, the first and second semiconductor regions alternately arranged in a direction parallel to a surface of the semiconductor layer, repeatedly, includes repeatedly executing a set of processes including: a depositing process of forming an epitaxial growth layer of the first conductivity type having an impurity concentration that is lower than an impurity concentration of the semiconductor layer; a fifth implanting process of selectively ion implanting a second-conductivity-type impurity into the epitaxial growth layer; and a sixth implanting process of ion implanting a group 18 element into the epitaxial growth layer. The set of processes is repeatedly executed so as to stack on the semiconductor layer, the epitaxial growth layer forming the parallel pn layer.

In the method, the sixth implanting process includes ion implanting the group 18 element into the epitaxial growth layer only at a position at which the second-conductivity-type impurity is ion implanted.

In the method, the fifth implanting process includes: forming on a surface of the epitaxial growth layer, a first mask having an opening at a portion corresponding to a formation region of the second semiconductor region, and ion implanting the second-conductivity-type impurity through the first mask. The sixth implanting process includes ion implanting the group 18 element through the first mask.

The method further includes a seventh implanting process of ion implanting the group 18 element into the epitaxial growth layer at a second position different from the position at which the second-conductivity-type impurity is ion implanted. The seventh implanting process is executed each time the set of processes is repeated or at intervals of a predetermined number of times of repetition of the set of processes.

In the method, the fifth implanting process includes ion implanting at intervals of a predetermined number of times of repetition of the set of processes, the group 18 element into the epitaxial growth layer only at a position at which the second-conductivity-type impurity is ion implanted.

The method further includes forming on the semiconductor layer before the depositing process, a low-concentration semiconductor layer of the first conductivity type having an impurity concentration that is lower than an impurity concentration of the first semiconductor region.

In the method, the second-conductivity-type impurity has a diffusion coefficient larger than a diffusion coefficient of the group 18 element.

In the method, the first-conductivity-type impurity has a diffusion coefficient larger than a diffusion coefficient of the group 18 element.

In the method, the group 18 element is argon.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
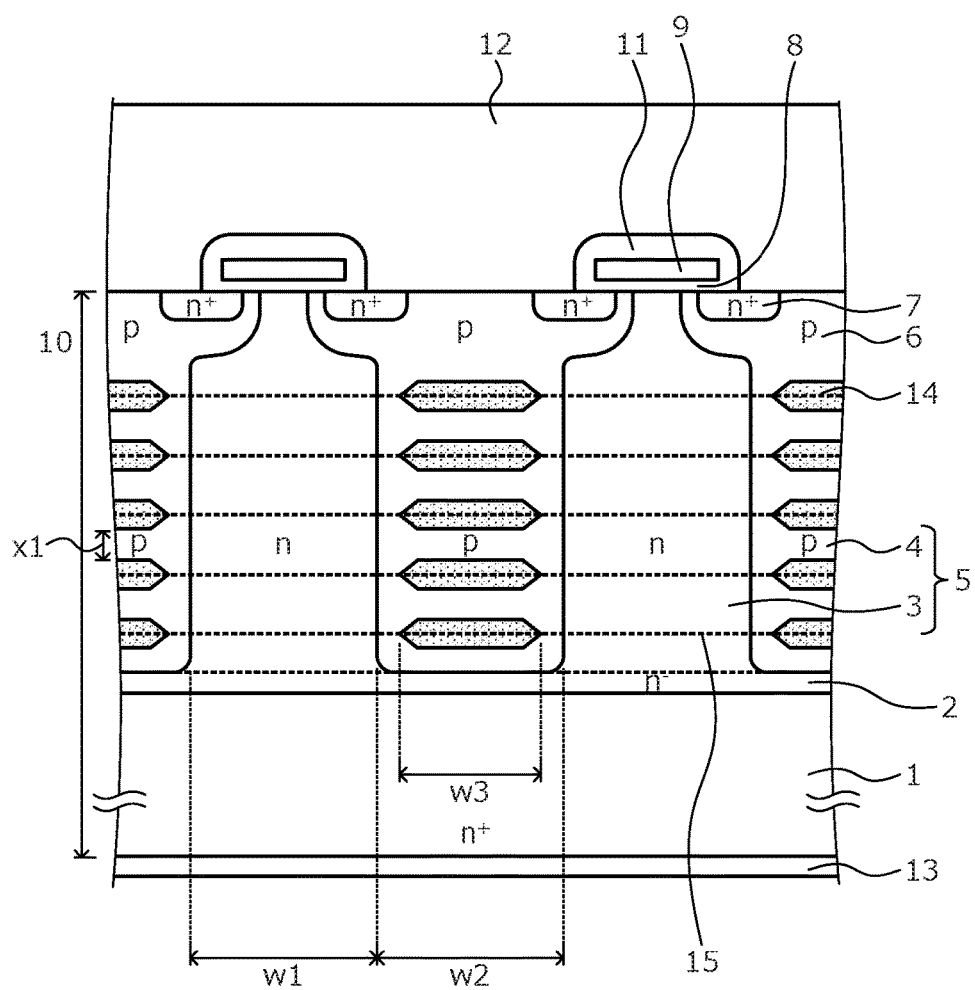
FIG. 1 is a cross-sectional view of a structure of a semiconductor device according to a first embodiment.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, +or − appended to n or p means that the impurity concentration is higher or lower, respectively, than layers and regions without +or −, and represents one example. In the description of the embodiments below and the accompanying drawings, main portions that are identical will be given the same reference numerals and will not be repeatedly described.

A structure of a semiconductor device according to a first embodiment will be described. FIG. 1 is a cross-sectional view of the structure of the semiconductor device according to the first embodiment. The semiconductor device according to the first embodiment depicted in FIG. 1 is a super-junction MOSFET (hereinafter referred to as SJ-MOSFET) having a drift layer that is a parallel pn layer 5 formed by repeatedly arranging alternately in a direction parallel to a substrate body main surface (lateral direction), an n-type region (first semiconductor region of a first conductivity type) 3 and a p-type region (second semiconductor region of a second conductivity type) 4 having an increased impurity concentration. The parallel pn layer 5 is stacked via an n$^-$-type buffer layer (low-concentration semiconductor layer of a first conductivity type) 2 on a front surface of an n$^+$-type semiconductor substrate 1 forming an n$^+$-type drain layer (semiconductor layer of the first conductivity type) to constitute a semiconductor substrate base 10. The n⁻-type buffer layer 2 may be omitted.

In this embodiment, widths w1, w2 and impurity concentrations in the depth direction of the n-type region 3 and the p-type region 4 of the parallel pn layer 5 are set such that the parallel pn layer 5 has a total p-type impurity amount in the p-type region 4 larger than a total n-type impurity amount in the n-type region 3 (the layer becomes p-rich). This is because the avalanche resistance may be improved as compared to a case of making the total impurity amount of n-type impurity in the n-type region 3 greater than that of p-type impurity in the p-type region 4 (making the layer n-rich).

A group 18 element (i.e., an element that is a member of group 18 of the periodic table, or more specifically, a noble gas element) is introduced into the parallel pn layer 5. The group 18 element introduced into the parallel pn layer 5 forms a level trapping electrons in a band gap of silicon (Si) and functions as an electron trap. Therefore, by introducing the group 18 element into the parallel pn layer 5, the critical field intensity may be increased and the avalanche resistance may be improved. The group 18 element does not act as a dopant (donor, acceptor). Therefore, the total impurity amounts of the n-type region 3 and the p-type region 4 of the parallel pn layer 5 do not vary from those in a case without the introduction of the group 18 element. For example, argon (Ar) is the group 18 element introduced into the parallel pn layer 5. A case of using argon as the group 18 element will hereinafter be described.

A region 14 with argon introduced therein (hereinafter referred to as an argon introduced region (first region): hatched portion in FIG. 1) in the parallel pn layer 5 is arranged in the p-type region 4 away from a pn junction between the p-type region 4 and the n-type region 3. For example, when the argon introduced region is arranged in the n-type region 3 of the parallel pn layer 5, electrons are trapped in the n-type region 3 of the parallel pn layer 5, so that the ON resistance of the SJ-MOSFET increases. By arranging the argon introduced region 4 only in the p-type region 4 of the parallel pn layer 5, the ON resistance of the SJ-MOSFET may be prevented from increasing. Leak current may be suppressed because the argon introduced region 14 does not reach the pn junction between the n-type region 3 and the p-type region 4 of the parallel pn layer 5.

The multiple argon introduced regions 14 are formed by ion implantation of argon into respective multiple epitaxial growth layers stacked for forming the parallel pn layer 5 as described later and are arranged away from each other at an interval x1 corresponding to a thickness of each of the epitaxial growth layers. A dose amount of argon in each of the argon introduced regions 14 is $1 \times 10^{15}/cm^2$ or less, for example. This is because when the dose amount of argon in the argon introduced region 14 exceeds $1 \times 10^{15}/cm^2$, crystal defects increase at the argon ion implantation positions whereby the epitaxial growth layer may not grow at the argon ion implantation positions.

As the percentage of the argon introduced regions 14 in the parallel pn layer 5 increases, the avalanche resistance improvement effect becomes higher. For example, by providing the argon introduced regions 14 uniformly in the depth direction in the p-type region 4 of the parallel pn layer 5, the avalanche resistance in the depth direction may be improved uniformly and the avalanche resistance may be stably obtained regardless of process variations. Therefore, the intervals x1 between the argon introduced regions 14 facing each other in the depth direction may be narrowed by, for example, reducing the thicknesses of the multiple epitaxial growth layers stacked for forming the parallel pn layer 5 as thin as possible, so that the argon introduced regions 14 are nearly uniformly provided in the depth direction within the p-type region 4 of the parallel pn layer 5.

In FIG. 1, horizontal broken lines 15 in the parallel pn layer 5 indicate boundaries between the multiple epitaxial growth layers constituting the parallel pn layer 5 (similarly in FIGS. 11, 20, 23, and 27). FIG. 1 depicts a case of stacking six epitaxial growth layers to constitute the parallel pn layer 5 (the same applies to FIGS. 11, 20, 23, 27, 33, and 36). The horizontal broken lines 15 depicted in the argon introduced regions 14 indicate the boundaries of the multiple epitaxial growth layers and the argon ion implantation positions (ion implantation planes) of the argon ion implantation performed for forming the argon introduced regions 14, (similarly in FIGS. 10, 11, 19, 20, 22, 23, 26, 27, and 32).

On a front surface (the surface on the side of the parallel pn layer 5) of the semiconductor substrate base 10, a MOS gate structure is provided with, for example, a general planar gate structure made up of a p-type base region 6, an n⁺-type source region 7, a gate insulating film 8, and a gate electrode 9. The p-type base region 6 is selectively provided in a front surface layer of the front surface of the semiconductor substrate base 10. The p-type base region 6 faces the p-type region 4 of the parallel pn layer 5 in the depth direction and is in contact with the p-type region 4. The width of the p-type base region 6 is wider than the width w2 of the p-type region 4 and the p-type base region 6 is provided from the p-type region 4 facing thereto in the depth direction, into the n-type region 3 adjacent to the p-type region 4.

The n⁺-type source region 7 is selectively provided in the p-type base region 6. A p⁺-type contact region (not depicted) may be provided in the p-type base region 6. On the surface of a portion of the p-type base region 6 in interposed between the n⁺-type source region 7 and the n-type region 3 of the parallel pn layer 5, the gate electrode 9 is provided via the gate insulating film 8. A source electrode 12 is in contact with the n⁺-type source region 7 and the p⁺-type contact region and is electrically insulated from the gate electrode 9 by an interlayer insulating film 11. A drain electrode 13 is provided on a back surface (a back surface of the n⁺-type semiconductor substrate 1) of the semiconductor substrate base 10.

Figure 2:
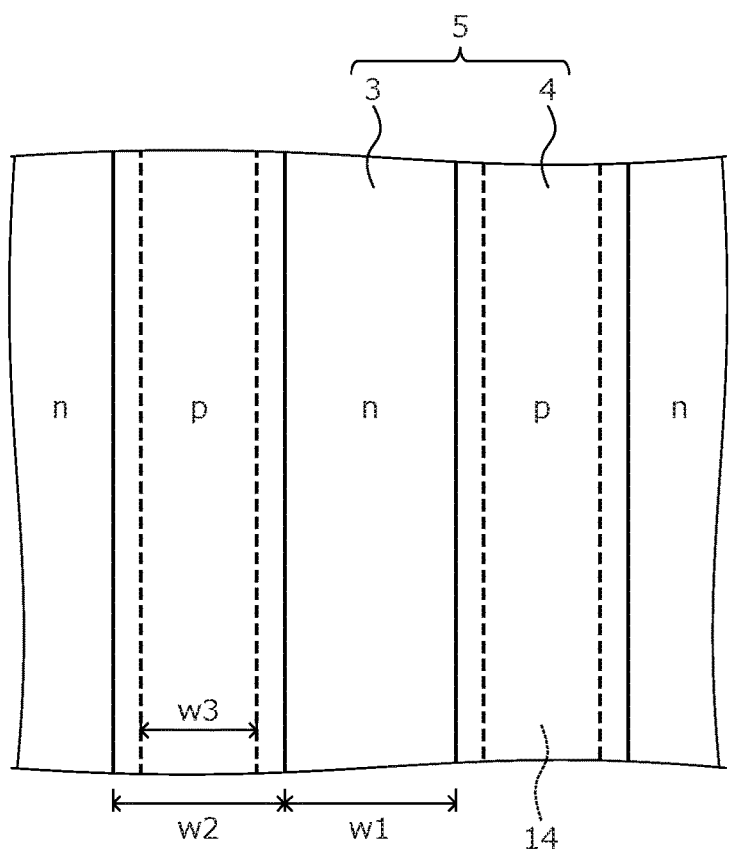
FIGS. 2, 3, and 4 are plane views of examples of a planar shape of argon introduced regions of the semiconductor device according to the first embodiment.
Figure 3:
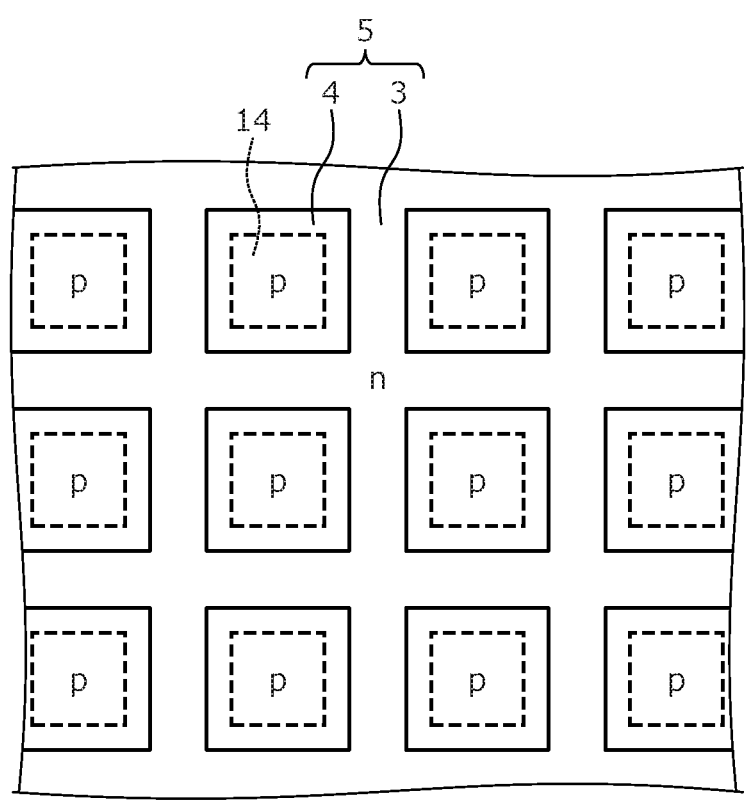
Figure 4:
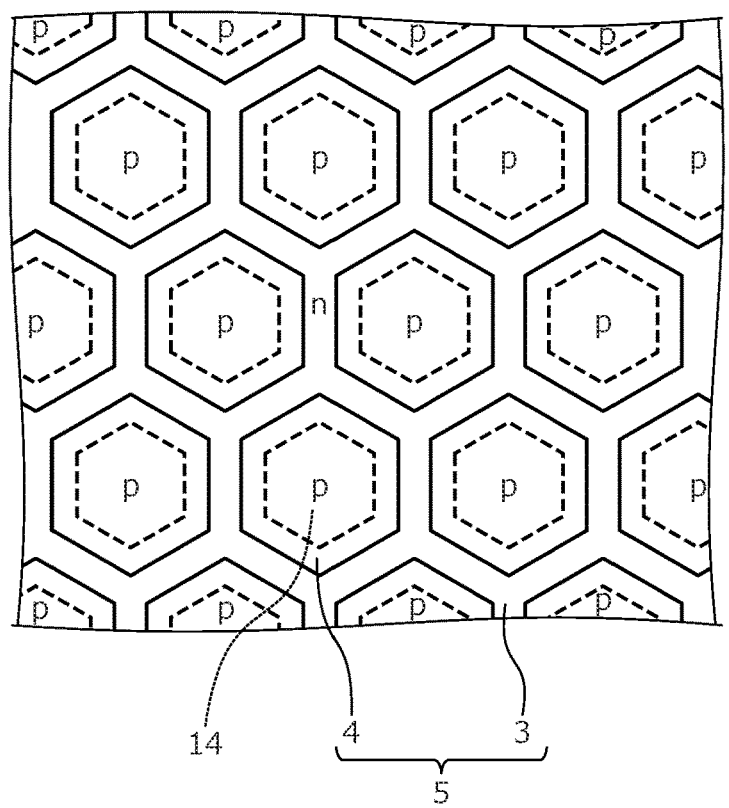

The planar shape of the argon introduced regions 14 will be described. FIGS. 2, 3, and 4 are plane views of examples of the planar shape of the argon introduced regions of the semiconductor device according to the first embodiment. In FIGS. 2 to 4, a planar shape of the argon introduced regions 14 is indicated by a broken line. As depicted in FIG. 2, the parallel pn layer 5 may have, for example, a planar layout in which the n-type region 3 and the p-type region 4 are alternately arranged in stripes, repeatedly. The planar layout is the planar shape and arrangement of parts as viewed from the front surface side of the semiconductor substrate base 10. In this case, the argon introduced regions 14 have a linear planar shape in which the width w3 is narrower than the width w2 of the p-type region 4, the linear planar shape extending in the same direction as the direction of the p-type region 4 extending in stripes and arranged in the center of the p-type region 4, for example.

As depicted in FIGS. 3 and 4, the parallel pn layer 5 may have a planar layout in which the p-type regions 4 are arranged in a matrix with the n-type region 3 arranged in a lattice shape surrounding the p-type regions 4. The planar shape of the p-type regions 4 arranged in a matrix may be a rectangular shape (see FIG. 3) or a hexagonal shape (see FIG. 4), for example. This is because the area ratio between the n-type region 3 and the p-type region 4 of the parallel pn layer 5 may be adjusted easily to a predetermined ratio so that it is easy to make the total impurity amounts of the n-type region 3 and the p-type region 4 of the parallel pn layer 5 substantially the same or to achieve a p-rich design. In this case, the argon introduced regions 14 have a smaller surface area than the p-type regions 4 and the same planar shape as the p-type regions 4 and are arranged in the centers of the p-type regions 4.

Figure 5:
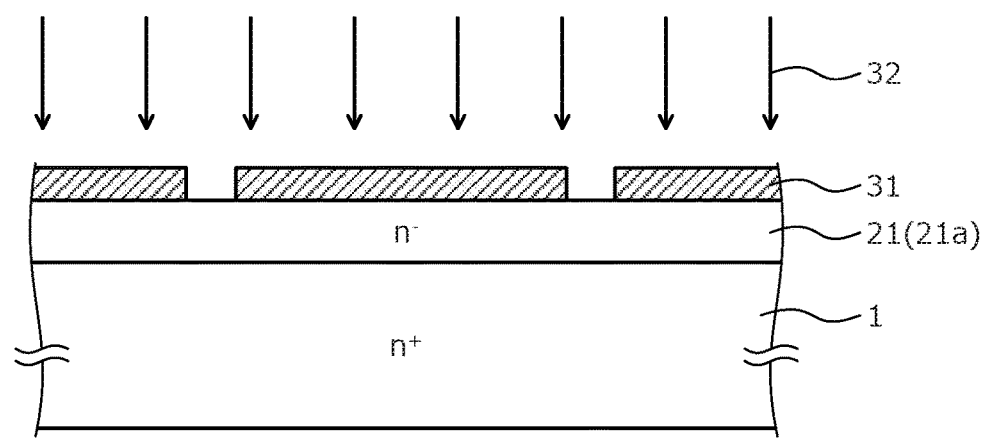
FIGS. 5, 6, 7, 8, 9, and 10 are cross-sectional views of states during manufacturing of the semiconductor device according to the first embodiment.

A method of manufacturing the semiconductor device according to the first embodiment will be described. FIGS. 5, 6, 7, 8, 9, and 10 are cross-sectional views of states during manufacturing of the semiconductor device according to the first embodiment. First, as depicted in FIG. 5, the n$^+$-type semiconductor substrate (semiconductor wafer) 1 forming an n$^+$-type drain layer is prepared. By using an epitaxial growth method, an n$^-$-type semiconductor layer 21 (n$^-$-type epitaxial growth layer 21a) having an impurity concentration lower than that of the n-type region 3 of the parallel pn layer 5 is deposited (formed) on the front surface of the n$^+$-type semiconductor substrate 1. Instead of the n$^-$-type semiconductor layer 21, a non-doped semiconductor layer may be deposited. The n$^+$-type drain layer may be an n-type semiconductor substrate (semiconductor wafer) and, after grinding the back surface of the n-type semiconductor substrate, ion implantation of an n-type impurity may be performed from the back surface to form an n$^+$-type drain layer having a high impurity concentration.

Figure 6:
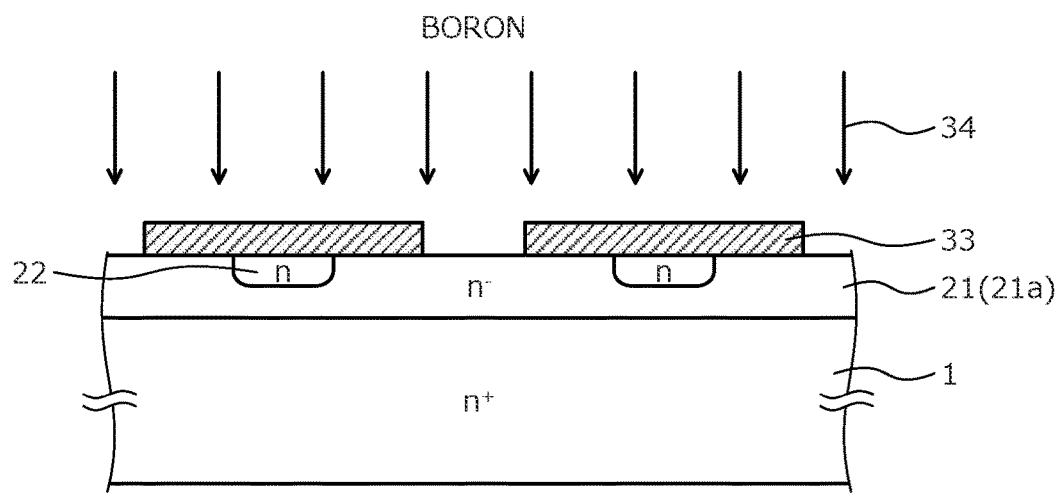

Subsequently, on the surface of the n$^-$-type semiconductor layer 21, a first ion implantation mask (second mask) 31 made up of, for example, a resist material or an oxide film (SiO$_2$) is formed with an opening in a portion corresponding to a formation region of the n-type region 3 of the parallel pn layer 5. Ion implantation 32 of an n-type impurity (dopant) such as phosphorus (P) is performed by using the first ion implantation mask 31 as a mask. As a result, as depicted in FIG. 6, an n-type impurity region 22 is selectively formed in a surface layer of the n$^-$-type semiconductor layer 21. The first ion implantation mask 31 is then removed.

Figure 7:
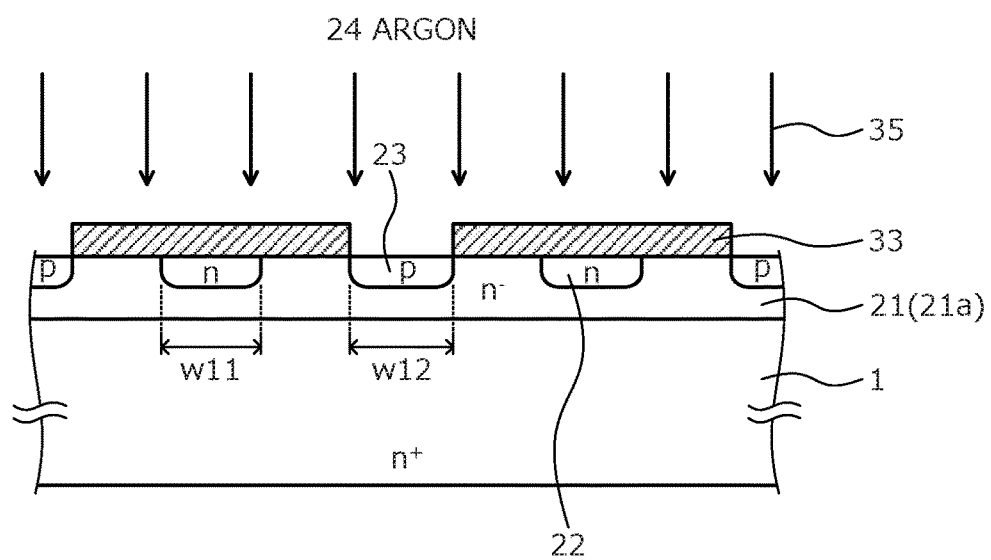

Subsequently, on the surface of the n$^-$-type semiconductor layer 21, a second ion implantation mask (first mask) 33 made up of, for example, a resist material or an oxide film is formed with an opening at a portion corresponding to a formation region of the p-type region 4 of the parallel pn layer 5. Ion implantation 34 of a p-type impurity (dopant) such as boron (B) is performed by using the second ion implantation mask 33 as a mask. As a result, as depicted in FIG. 7, a p-type impurity region 23 is selectively formed in the surface layer of the n$^-$-type semiconductor layer 21. For the ion implantation 34 for forming the p-type impurity region 23, a p-type impurity having a diffusion coefficient larger than that of argon (a group 18 element) 24 described later is used.

The n-type impurity region 22 and the p-type impurity region 23 are respectively formed with widths w11, w12 to such an extent that the regions come into contact with each other when diffused by heat treatment (drive) described later. The widths w11 and w12 of the n-type impurity region 22 and the p-type impurity region 23 are made narrower than the widths w1 and w2, respectively, of the n-type region 3 and the p-type region 4 of the completed parallel pn layer 5.

An n-type impurity region 22 may be formed by the ion implantation 32 of the n-type impurity into the entire surface of the n$^-$-type semiconductor layer 21 (or a non-doped semiconductor layer) without using the first ion implantation mask 31, and the formation of the p-type impurity region 23 and the introduction of the argon 24 may be performed selectively in this n-type impurity region 22. Instead of the n$^-$-type semiconductor layer 21, an n-type semiconductor layer having the same impurity concentration as the n-type region 3 of the parallel pn layer 5 may be deposited on the n$^+$-type semiconductor substrate 1. In this case, the formation of the first ion implantation mask 31 and the ion implantation 32 of the n-type impurity may be eliminated.

Figure 8:
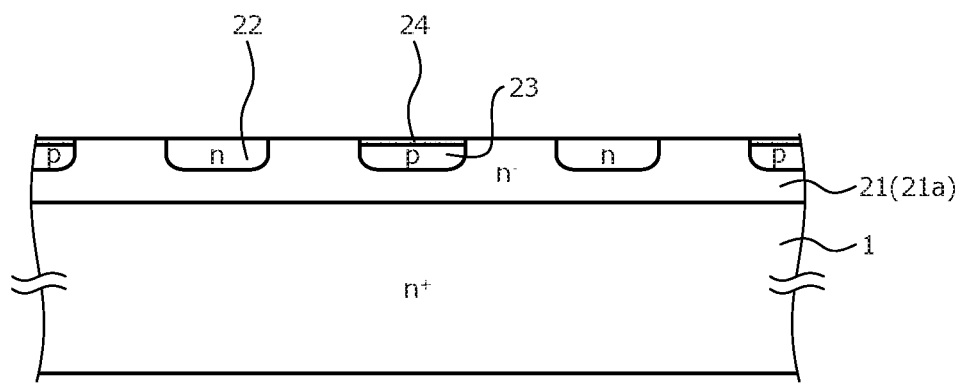

Subsequently, the same second ion implantation mask 33 used for forming the p-type impurity region 23 is used as a mask to perform ion implantation 35 of the argon 24. As a result, as depicted in FIG. 8, the argon 24 is introduced into the p-type impurity region 23. In FIG. 8, a portion corresponding to the introduction of the argon 24 into the p-type impurity region 23 is indicated by hatching (similarly in FIGS. 9, 16 to 18, 21, 24, 25, 30, 31, 34, and 37). The second ion implantation mask 33 is then removed. The ion implantation 35 of the argon 24 is performed after the ion implantation 34 for forming the p-type impurity region 23. The reason is as follows.

When the ion implantation 34 for forming the p-type impurity region 23 is performed after the ion implantation 35 of the argon 24, the ion implantation 34 for forming the p-type impurity region 23 becomes unstable and the impurity concentration of the p-type impurity region 23 varies. The reason is that this leads to a poor balance of the impurity concentrations between the n-type region 3 and the p-type region 4 of the parallel pn layer 5. The second and third ion implantations 34, 35 may be formed by using the same second ion implantation mask 33, and the order of formation may be changed between the n-type impurity region 22 and the p-type impurity region 23.

Subsequently, the n$^-$-type epitaxial growth layer 21a is newly deposited as the n$^-$-type semiconductor layer 21 (i.e., the thickness of the n$^-$-type semiconductor layer 21 is increased) to cover the n-type impurity region 22 and the p-type impurity region 23. The formation of the n-type impurity region 22, the formation of the p-type impurity region 23, and the introduction of the argon 24 are then performed sequentially, by using the same method as described above. As a result, the n-type impurity region 22 and the p-type impurity region 23 are formed in the n$^-$-type epitaxial growth layer 21a newly deposited as the n$^-$-type semiconductor layer 21, and the argon 24 is introduced into the p-type impurity region 23.

In this case, the n-type impurity region 22 formed in the n$^-$-type epitaxial growth layer 21a newly deposited as the n$^-$-type semiconductor layer 21 is arranged to face the n-type impurity region 22 in the underlying n$^-$-type epitaxial growth layer 21a in the depth direction. Additionally, the p-type impurity region 23 formed in the n$^-$-type epitaxial growth layer newly deposited as the n$^-$-type semiconductor layer 21 is arranged to face the p-type impurity region 23 in the underlying n$^-$-type epitaxial growth layer 21a in the depth direction. The n-type impurity regions 22 facing each other in the depth direction may be in contact with each other. The p-type impurity regions 23 facing each other in the depth direction may be in contact with each other.

Figure 9:
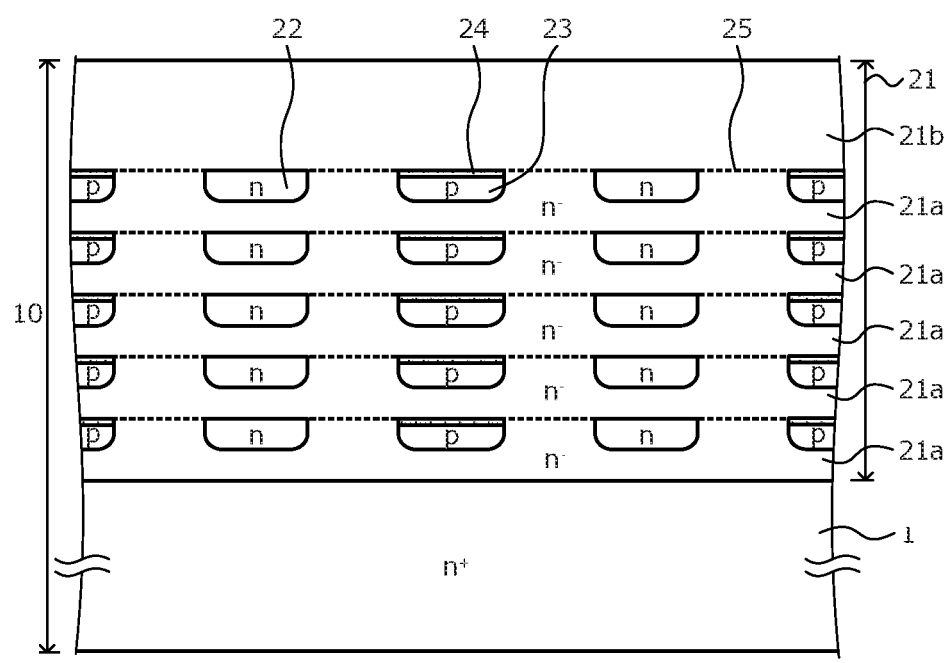

A step including the formation of the n-type impurity region 22, the formation of the p-type impurity region 23, and the introduction of the argon 24 as a set in this way is repeatedly performed each time the n$^-$-type epitaxial growth layer 21a is deposited as the n$^-$-type semiconductor layer 21. As a result, as depicted in FIG. 9, in the n$^-$-type semiconductor layer 21, the multiple n-type impurity regions 22 are formed to face each other in the depth direction at a certain distance from each other, and the multiple p-type impurity regions 23 are formed to face each other in the depth direction at a certain distance from each other. The argon 24 is introduced into all of the p-type impurity regions 23.

Therefore, the n⁻-type epitaxial growth layers 21a having the n-type impurity regions 22 and the p-type impurity regions 23 formed in the same planar layout and the argon 24 introduced into the p-type impurity regions 23 are stacked in multiple layers. The n⁻-type epitaxial growth layer 21b is further deposited as the n⁻-type semiconductor layer 21 to increase the thickness of the n⁻-type semiconductor layer 21 to form the semiconductor substrate base 10 having a predetermined thickness.

The argon 24 is not introduced into the uppermost n⁻-type epitaxial growth layer 21b lastly stacked as the n⁻-type semiconductor layer 21 (the portion of the n⁻-type semiconductor layer 21 lastly increased in thickness). The formation of the n-type impurity region 22 and the formation of the p-type impurity region 23 may be performed as needed. In FIG. 9, horizontal broken lines 25 in the n⁻-type semiconductor layer 21 indicate boundaries between the multiple n⁻-type epitaxial growth layers constituting the n⁻-type semiconductor layer 21 (similarly in FIGS. 17, 18, 21, 24, and 25).

Figure 10:
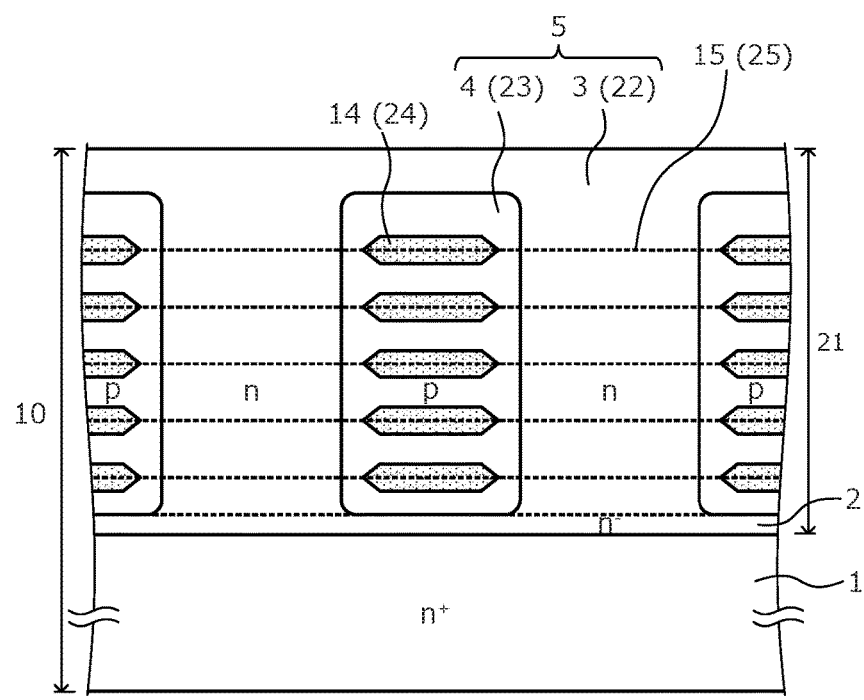

Subsequently, the n-type impurity regions 22 and the p-type impurity regions 23 are diffused by a heat treatment (drive). As a result, as depicted in FIG. 10, the n-type impurity regions 22 facing each other in the depth direction are connected in the n⁻-type semiconductor layer 21 to form the n-type region 3 of the parallel pn layer 5. Additionally, the p-type impurity regions 23 facing each other in the depth direction are connected to form the p-type region 4 of the parallel pn layer 5. The n-type region 3 and the p-type region 4 of the parallel pn layer 5 are in contact with each other. A portion of the n⁻-type semiconductor layer 21 in contact with the n⁺-type semiconductor substrate 1 remains as the n⁻-type buffer layer 2.

The argon 24 is also diffused by this heat treatment and remains as the multiple argon introduced regions 14 in the p-type region 4 of the parallel pn layer 5. The argon 24 introduced into the p-type impurity regions 23 has a smaller diffusion coefficient than the p-type impurity for forming the p-type impurity regions 23 as described above and therefore remains within the p-type impurity regions 23 even after undergoing this heat treatment and a heat history of subsequent steps (e.g., thermal oxidation for forming the gate insulating film 8). Therefore, the argon introduced regions 14 may be formed in the p-type region 4 of the parallel pn layer 5 so as not to reach the pn junction between the p-type region 4 and the n-type region 3.

Subsequently, the p-type base region 6 is selectively formed by photolithography and ion implantation of a p-type impurity in the surface layer of the n⁻-type semiconductor layer 21 to a depth reaching the p-type region 4 of the parallel pn layer 5. The n⁺-type source region 7 is then selectively formed by photolithography and ion implantation of a p-type impurity in the p-type base region 6. The semiconductor substrate base 10 is then thermally oxidized to form the gate insulating film 8 on the front surface (the surface on the side of the n⁺-type source region 7) of the semiconductor substrate base 10. For example, a polysilicon (poly-Si) layer is then deposited on the gate insulating film 8 and patterned to leave a portion serving as the gate electrode 9.

Subsequently, the interlayer insulating film 11 is formed to cover the gate electrode 9. The interlayer insulating film 11 and the gate insulating film 8 are patterned by photolithography and etching to form a contact hole so that the n⁺-type source region 7 is exposed. The source electrode 12 is formed on the front surface of the semiconductor substrate base 10 and embedded in the contact hole. The drain electrode 13 is formed on the back surface of the semiconductor substrate base 10 (the back surface of the n⁺-type semiconductor substrate). Subsequently, the semiconductor wafer is cut (diced) into individual chips, and the SJ-MOSFET depicted in FIG. 1 is thereby completed.

When the argon introduced regions 14 are arranged at positions closer to the pn junction between the n-type region 3 and the p-type region 4 of the parallel pn layer 5, the avalanche resistance improvement effect becomes higher. Therefore, although not depicted, the argon introduced regions 14 may reach the pn junction between the n-type region 3 and the p-type region 4 of the parallel pn layer 5 in a direction parallel to the main surface of the semiconductor substrate base 10. When the argon introduced regions 14 reach the pn junction between the n-type region 3 and the p-type region 4 of the parallel pn layer 5, the leak current increases as described above. Therefore, the leak current of the SJ-MOSFET may be kept within an allowable range by, for example, adjusting the number of the argon introduced regions 14 reaching the pn junction between the n-type region 3 and the p-type region 4 of the parallel pn layer 5.

As described above, according to the first embodiment, by introducing the group 18 element functioning as an electron trap into the p-type region of the parallel pn layer, the critical field intensity may be increased and the avalanche resistance may be improved without changing the total impurity amounts of the n-type region 3 and the p-type region 4 of the parallel pn layer 5. Therefore, avalanche resistance may be improved while maintaining the breakdown voltage obtained from the total impurity amounts of the n-type region 3 and the p-type region 4 of the parallel pn layer 5.

Figure 11:
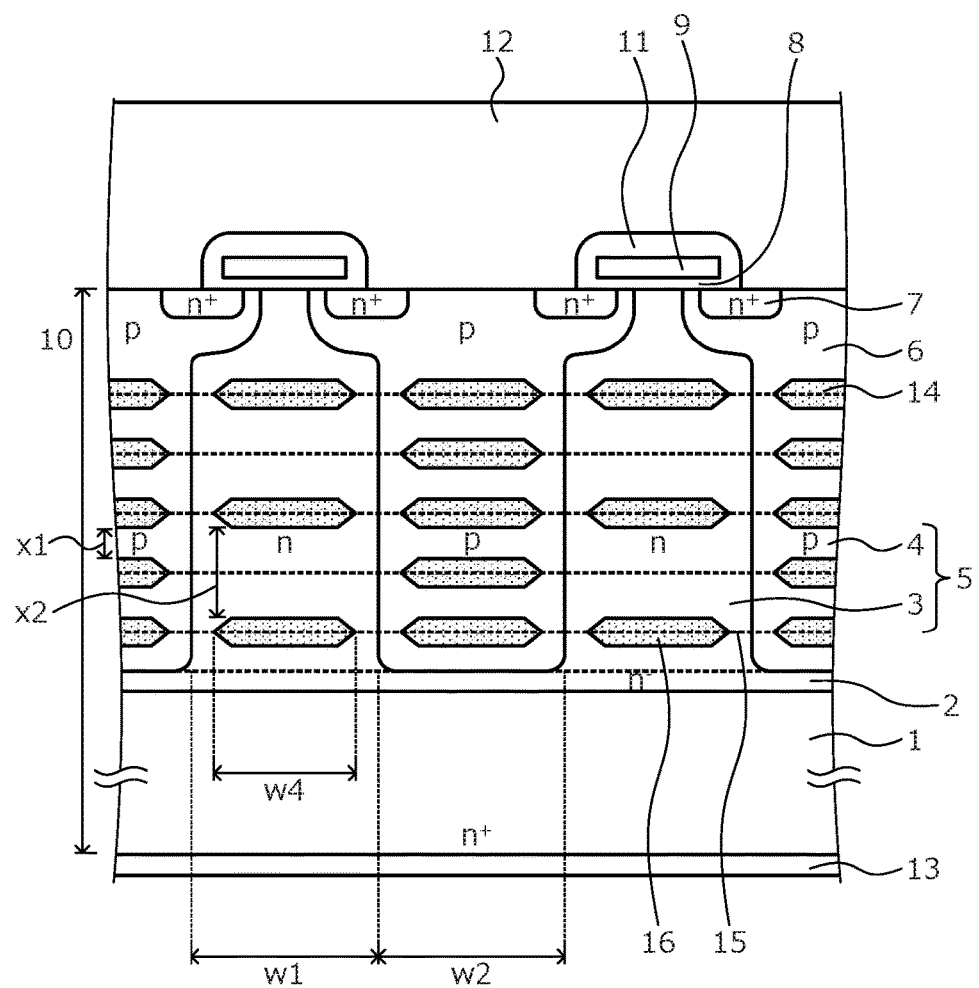
FIG. 11 is a cross-sectional view of a structure of the semiconductor device according to a second embodiment.

A structure of the semiconductor device according to a second embodiment will be described. FIG. 11 is a cross-sectional view of the structure of the semiconductor device according to the second embodiment. The semiconductor device according to the second embodiment differs from the semiconductor device according to the first embodiment in that multiple argon introduced regions (second regions) 16 are provided to face each other at a certain distance from each other in the depth direction also in the n-type region 3 of the parallel pn layer 5. An interval x2 between the argon introduced regions 16 facing each other in the depth direction in the n-type region 3 of the parallel pn layer 5 is wider than the interval x1 between the argon introduced regions 14 facing each other in the depth direction in the p-type region 4 of the parallel pn layer 5 (x1<x2). The configuration of the argon introduced regions 14 arranged in the p-type region 4 of the parallel pn layer 5 is the same as in the first embodiment.

For example, the argon introduced regions 16 in the n-type region 3 of the parallel pn layer 5 are arranged away from the pn junction between the p-type region 4 and the n-type region 3. The multiple argon introduced regions 16 are each formed by ion implantation of argon, for example, for every two or more layers (in this description, for every two layers) in multiple n⁻-type epitaxial growth layers stacked for forming the parallel pn layer 5 and are arranged away from each other in the depth direction at the interval x2 substantially twice as thick as each of the n⁻-type epitaxial growth layers. Therefore, the number of the argon introduced regions 16 facing each other in the depth direction in the n-type region 3 of the parallel pn layer 5 is smaller than the number of the argon introduced regions 14 facing each other in the depth direction in the p-type region 4 of the parallel pn layer 5.

The planar shape of the argon introduced regions 16 in the n-type region 3 of the parallel pn layer 5 is, for example, the same planar shape as that of the n-type region 3 of the parallel pn layer 5 and is a linear shape (see FIG. 2) or a lattice shape (see FIGS. 3 and 4) having a width w4 narrower than the width w1 of the n-type region 3 and is arranged in the center of the n-type region 3. Although the ON resistance is made higher as described above by providing the argon introduced regions 16 in the n-type region 3 of the parallel pn layer 5, the percentage of the argon introduced regions increases in the parallel pn layer 5 and therefore, the avalanche resistance may be improved further. Therefore, the semiconductor device according to the second embodiment is useful when priority is given to avalanche resistance over ON resistance.

A method of manufacturing a semiconductor device according to the second embodiment will be described. FIGS. 12, 13, 14, 15, 16, 17, 18, and 19 are cross-sectional views of states during manufacturing of the semiconductor device according to the second embodiment. First, after the n$^-$-type semiconductor layer 21 (n$^-$-type epitaxial growth layer: corresponding to reference numeral 21c of FIG. 12) is deposited on the front surface of the n$^+$-type semiconductor substrate 1, the n-type impurity region 22 is selectively formed in the surface layer of the n$^-$-type semiconductor layer 21 by the same method as in the first embodiment (see FIG. 5). In this case, for the ion implantation 32 for forming the n-type impurity region 22, an n-type impurity having a diffusion coefficient larger than that of argon (a group 18 element) 26 described later is used.

Figure 12:
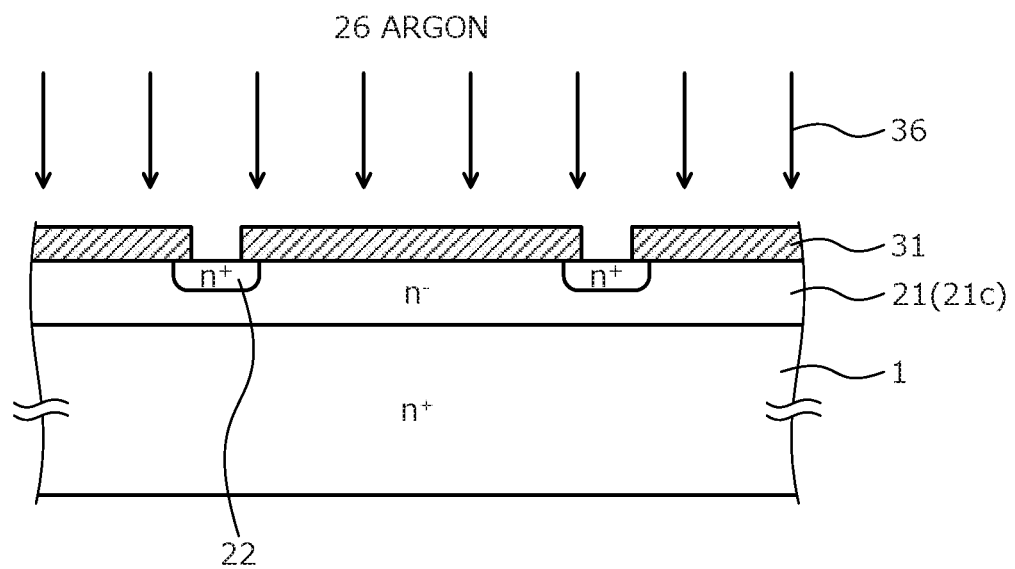
FIGS. 12, 13, 14, 15, 16, 17, 18, and 19 are cross-sectional views of states during manufacturing of the semiconductor device according to the second embodiment.
Figure 13:
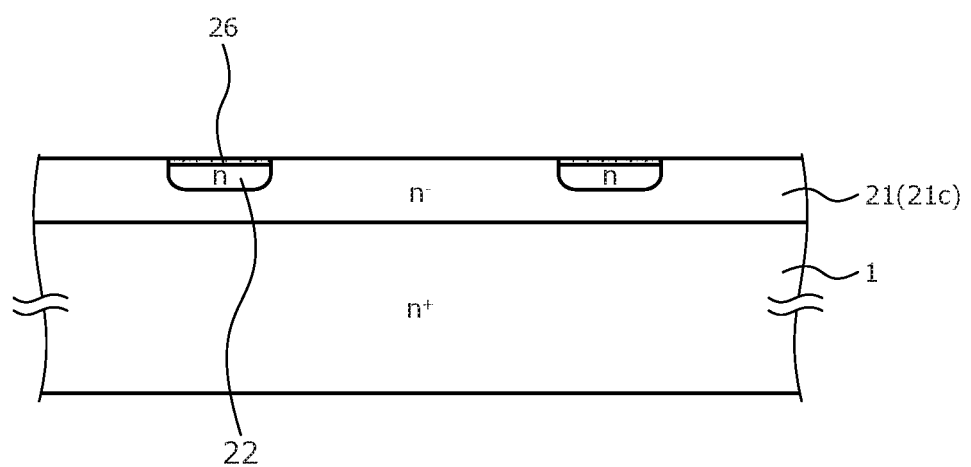

Subsequently, as depicted in FIG. 12, the same first ion implantation mask 31 used for forming the n-type impurity region 22 is used as a mask to perform ion implantation 36 of the argon 26 to introduce the argon 26 into the n-type impurity region 22 (FIG. 13). In FIG. 13, a portion corresponding to the introduction of the argon 26 into the n-type impurity region 22 is indicated by hatching (similarly in FIGS. 14 to 18). The ion implantation 36 of the argon 26 is performed after the ion implantation 32 for forming the n-type impurity region 22. The reason is the same as the reason why the ion implantation 35 of the argon 24 is performed after the ion implantation 34 for forming the p-type impurity region 23. The first ion implantation mask 31 is then removed.

Figure 14:
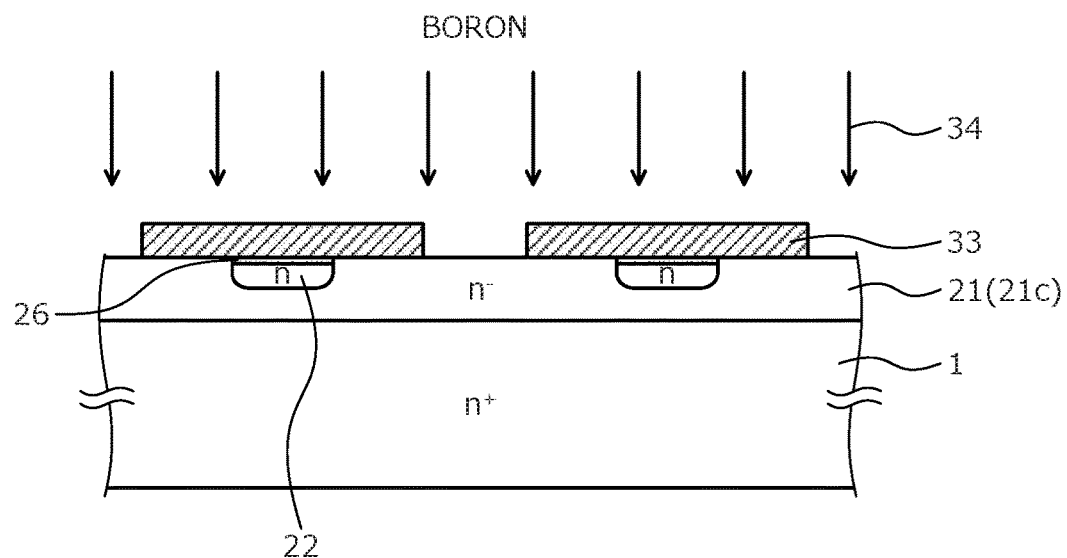
Figure 15:
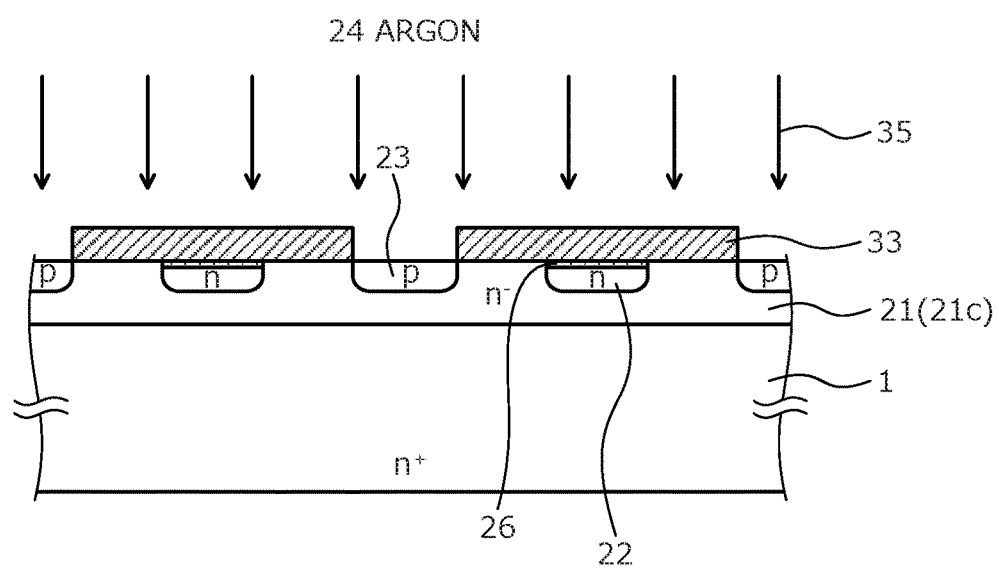
Figure 16:
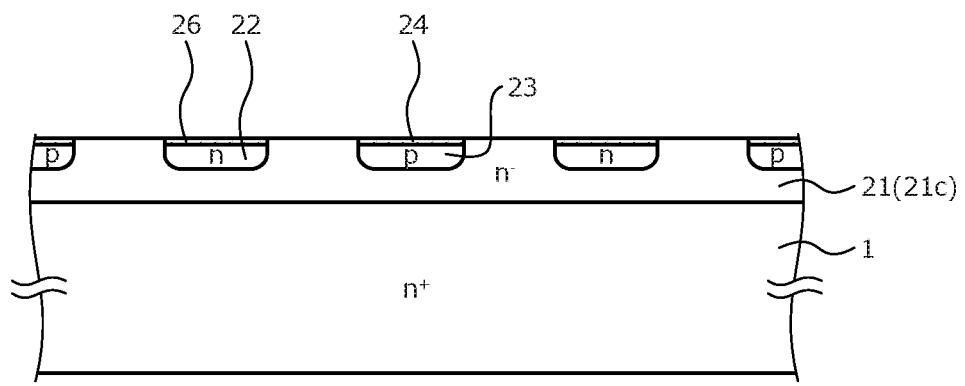
Figure 17:
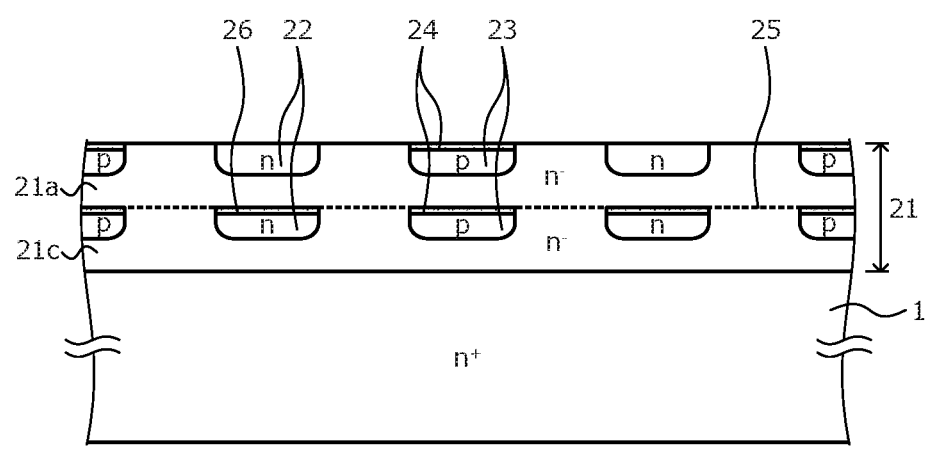

Subsequently, the p-type impurity region 23 is selectively formed in the surface layer of the n$^-$-type epitaxial growth layer 21c by the same method as in the first embodiment, and the argon 24 is introduced into the p-type impurity region 23 (FIGS. 14 to 16). The second ion implantation mask 33 is then removed. As depicted in FIG. 17, after the n$^-$-type epitaxial growth layer 21a is newly deposited as the n$^-$-type semiconductor layer 21 on the n$^-$-type epitaxial growth layer 21c, the formation of the n-type impurity region 22, the formation of the p-type impurity region 23, and the introduction of the argon 24 into the p-type impurity region 23 are performed similarly as in the first embodiment. In this case, the argon 26 is not introduced into the n-type impurity region 22.

A step including the formation of the n-type impurity region 22, the formation of the p-type impurity region 23, and the introduction of the argon 24 into the p-type impurity region 23 as a set in this way is repeatedly performed each time the n$^-$-type epitaxial growth layer 21a is deposited as the n$^-$-type semiconductor layer 21, including the introduction of the argon 26 into the n-type impurity region 22 every other time. Therefore, the introduction of the argon 26 into the n-type impurity region 22 is performed for every two n$^-$-type epitaxial growth layers stacked as the n$^-$-type semiconductor layer 21.

Figure 18:
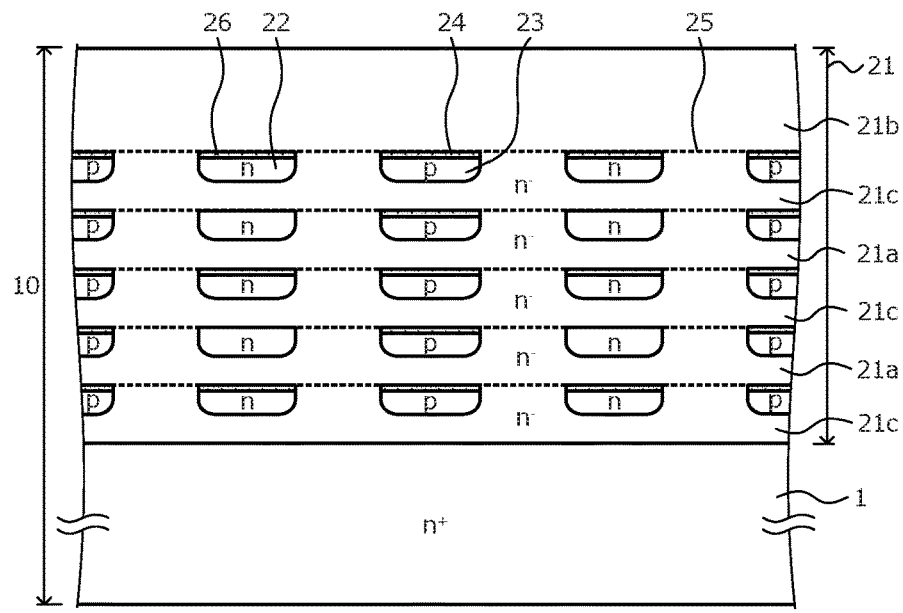

As a result, as depicted in FIG. 18, a repeated alternatingly stacked state is achieved by the n$^-$-type epitaxial growth layer 21c having the argon 26, 24 introduced into both the n-type impurity region 22 and the p-type impurity region 23 as well as the n$^-$-type epitaxial growth layer 21a having the argon 24 introduced only into the p-type impurity region 23 as in the first embodiment. Therefore, the argon 24 is introduced into all the p-type impurity regions 23 similarly in the first embodiment, and the argon 26 is introduced for every two layers into the multiple n-type impurity regions 22 facing each other in the depth direction.

Figure 19:
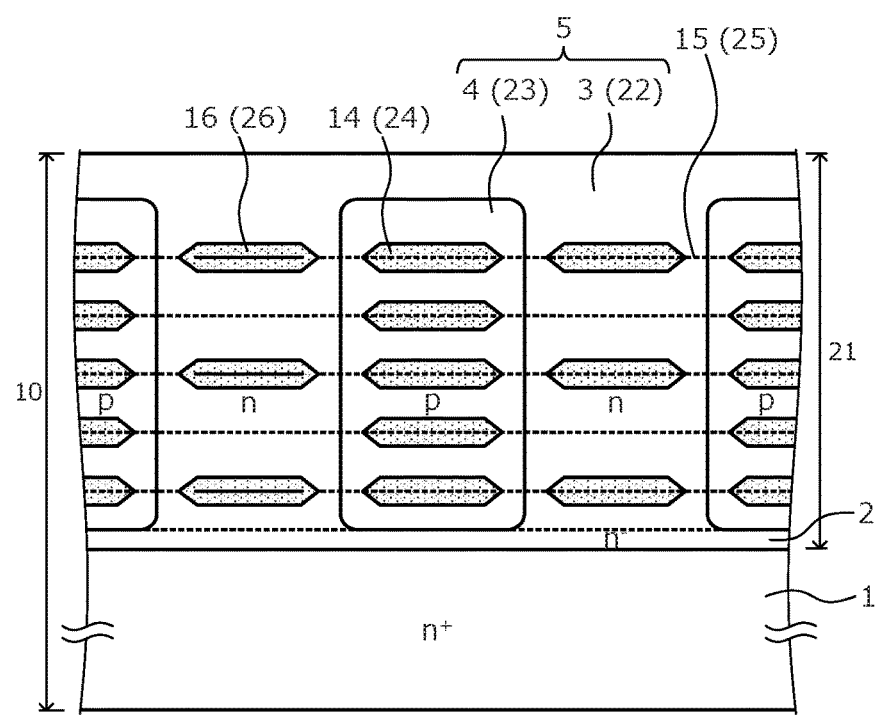

Subsequently, similarly in the first embodiment, the n$^-$-type epitaxial growth layer 21b forming the uppermost layer is deposited to increase the thickness of the n$^-$-type semiconductor layer 21 so as to form the semiconductor substrate base 10 having a predetermined thickness. The heat treatment (drive) is then performed to form the n-type region 3 of the parallel pn layer 5, the p-type region 4 of the parallel pn layer 5, and the n$^-$-type buffer layer 2 similarly in the first embodiment. Additionally, as a result of this heat treatment, the argon introduced regions 14, 16 are formed at the positions of the ion implantations 35, 36 of the argon 24, 26 (FIG. 19). Subsequently, similar to the first embodiment, the steps after the formation of the p-type base region 6 are performed sequentially, and the SJ-MOSFET depicted in FIG. 11 is thereby completed.

The argon 26 introduced into the n-type impurity regions 22 has a smaller diffusion coefficient than the n-type impurity for forming the n-type impurity region 22 as described above and therefore remains within the n-type impurity regions 22 even after undergoing the heat treatment (drive) and a heat history of subsequent steps. Therefore, the argon introduced region 16 in the n-type region 3 of the parallel pn layer 5 does not reach the pn junction between the p-type region 4 and the n-type region 3 as with the argon introduced region 14 in the p-type region 4 of the parallel pn layer 5.

As described above, according to the second embodiment, effects identical to those of the first embodiment may be obtained. Additionally, according to the second embodiment, the percentage of the argon introduced regions increases in the parallel pn layer and therefore, the avalanche resistance may be improved further.

Figure 20:
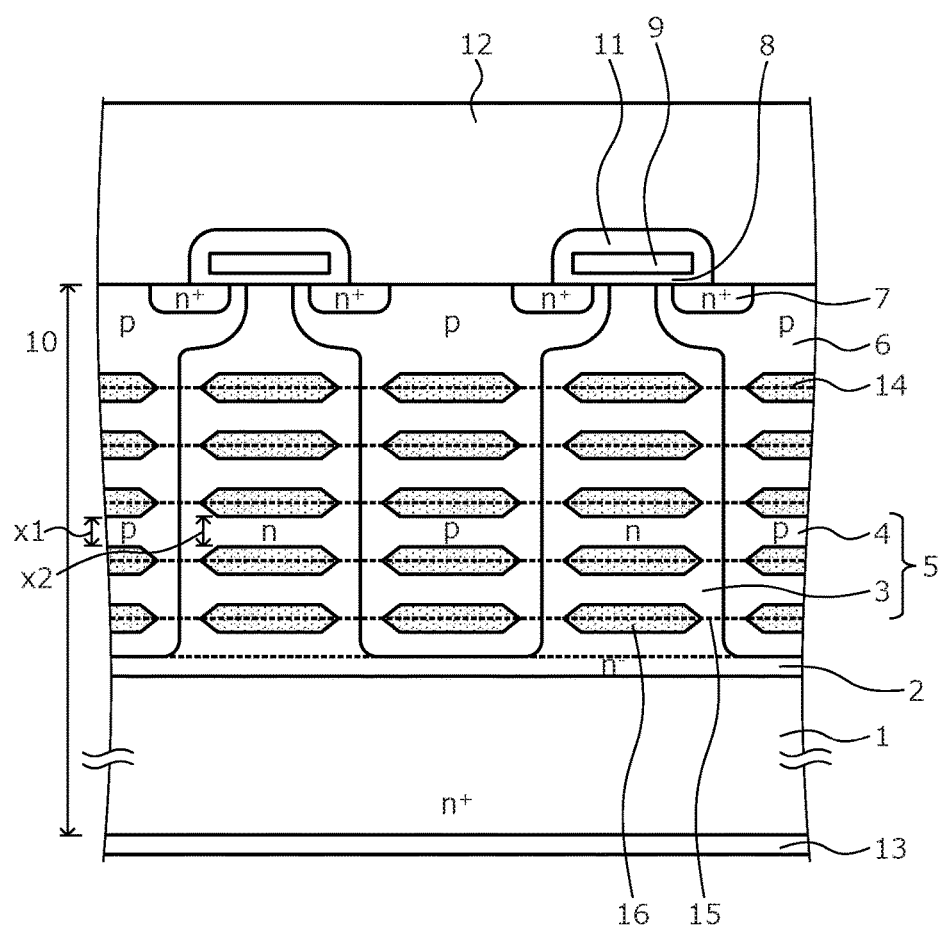
FIG. 20 is a cross-sectional view of a structure of the semiconductor device according to a third embodiment.

A structure of the semiconductor device according to a third embodiment will be described. FIG. 20 is a cross-sectional view of the structure of the semiconductor device according to the third embodiment. The semiconductor device according to the third embodiment differs from the semiconductor device according to the second embodiment in that the interval x2 between the argon introduced regions 16 facing each other in the depth direction in the n-type region 3 of the parallel pn layer 5 is made substantially the same as the interval x1 between the argon introduced regions 14 facing each other in the depth direction in the p-type region 4 of the parallel pn layer 5 (x1≈x2). The interval x2 between the argon introduced regions 16 facing each other in the depth direction is widened to such an extent that the ON resistance of the SJ-MOSFET may be kept within an allowable range.

Figure 21:
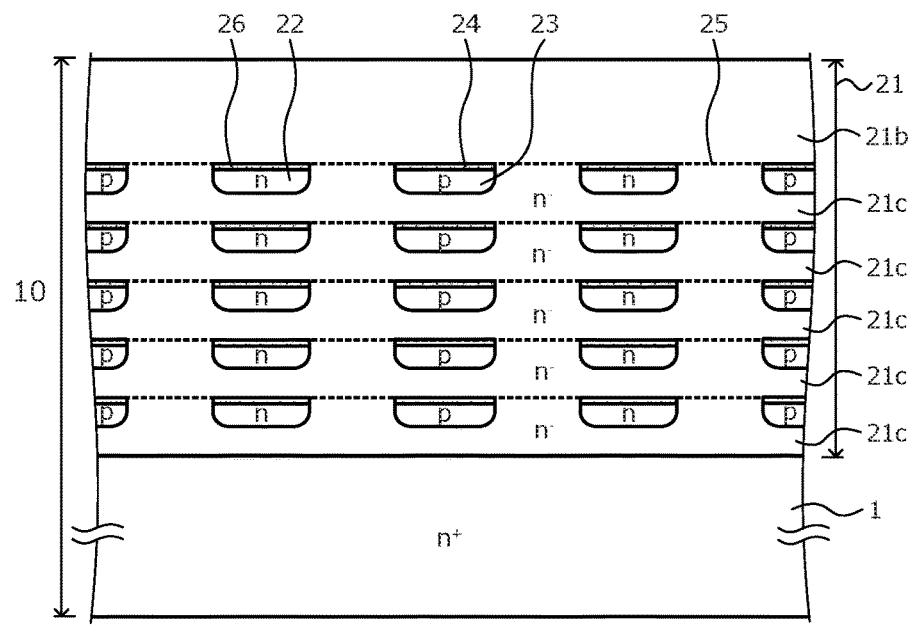
FIGS. 21 and 22 are cross-sectional views of states during manufacturing of the semiconductor device according to the third embodiment.
Figure 22:
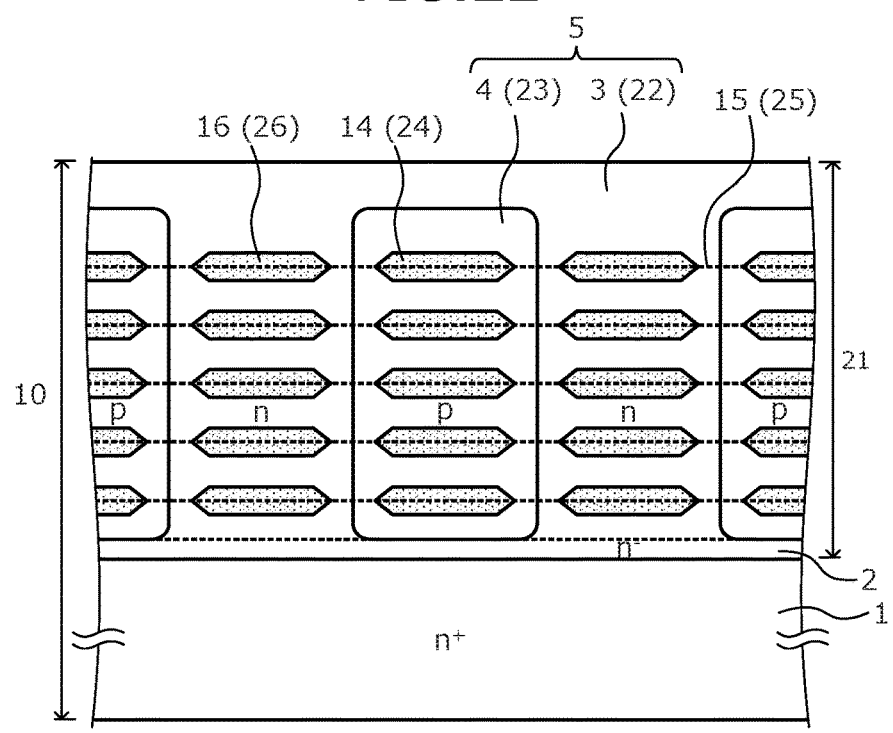

FIGS. 21 and 22 are cross-sectional views of states during manufacturing of the semiconductor device according to the third embodiment. The method of manufacturing a semiconductor device according to the third embodiment may be implemented by introducing the argon 26 into all the n-type impurity regions 22 formed in the n⁻-type semiconductor layer 21 in the method of manufacturing a semiconductor device according to the second embodiment. For example, first, by using the same method as in the second embodiment, a step including the formation of the n-type impurity region 22, the introduction of the argon 26 into the n-type impurity region 22, the formation of the p-type impurity region 23, and the introduction of the argon 24 as a set is repeatedly performed each time the n⁻-type epitaxial growth layer 21a is deposited as the n⁻-type semiconductor layer 21 (see FIGS. 5, 12 to 16).

As a result, as depicted in FIG. 21, the n-type impurity regions 22 and the p-type impurity regions 23 are formed in the same way as the first embodiment, and the argon 24 is introduced into all the p-type impurity regions 23, and the argon 26 is introduced into all the n-type impurity regions 22. Similar to the first embodiment, the n⁻-type epitaxial growth layer 21b forming the uppermost layer is then deposited to increase the thickness of the n⁻-type semiconductor layer 21 to form the semiconductor substrate base 10 having a predetermined thickness.

The heat treatment (drive) is then performed to form the n-type region 3 of the parallel pn layer 5, the p-type region 4 of the parallel pn layer 5, and the n⁻-type buffer layer 2 similar to the first embodiment. Additionally, as a result of this heat treatment, the argon introduced regions 14, 16 are formed at the positions of the ion implantations 35, 36 of the argon 24, 26 (FIG. 22). Subsequently, similar to the first embodiment, the steps after the formation of the p-type base region 6 are performed sequentially, and the SJ-MOSFET depicted in FIG. 20 is thereby completed.

As described above, according to the third embodiment, effects identical to those of the first and second embodiments may be acquired. Additionally, according to the third embodiment, the percentage of the argon introduced regions increases in the parallel pn layer and therefore, the avalanche resistance may be improved further.

Figure 23:
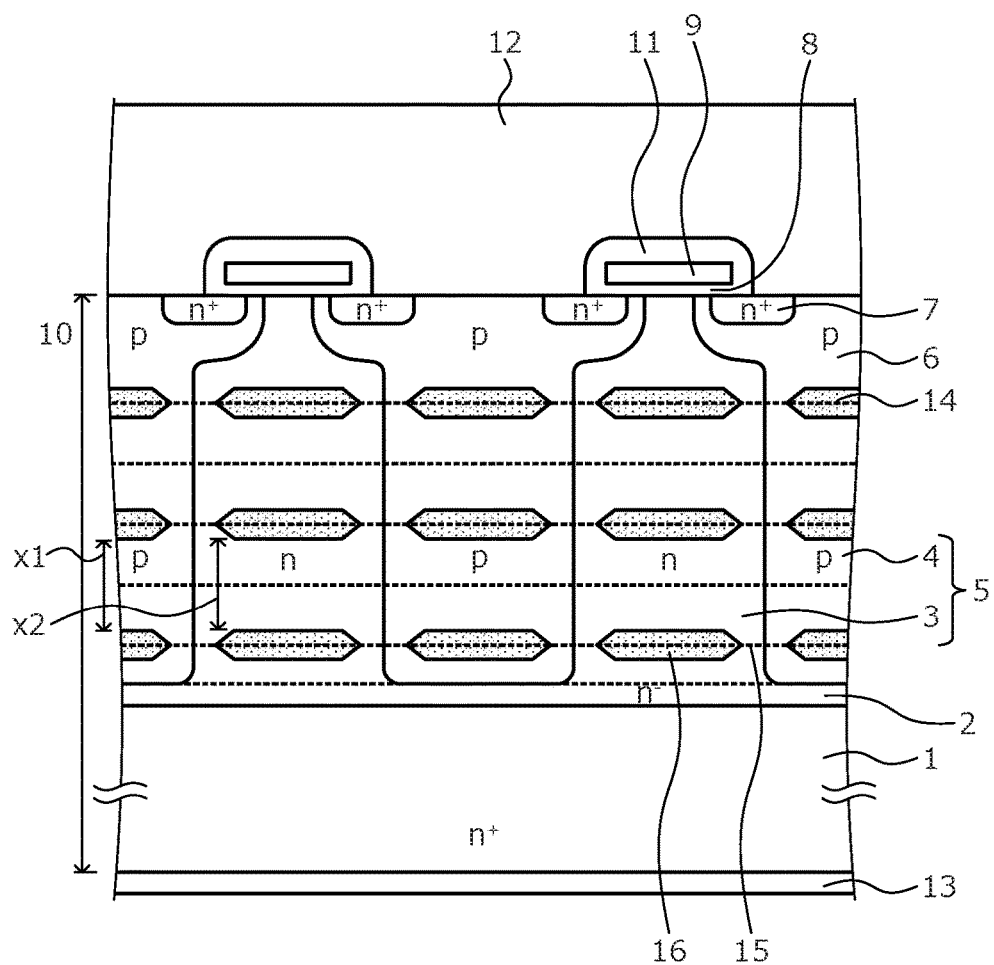
FIG. 23 is a cross-sectional view of a structure of the semiconductor device according to a fourth embodiment.

A structure of the semiconductor device according to a fourth embodiment will be described. FIG. 23 is a cross-sectional view of the structure of the semiconductor device according to the fourth embodiment. The semiconductor device according to the fourth embodiment differs from the semiconductor device according to the third embodiment in that the interval x1 between the argon introduced regions 14 facing each other in the depth direction in the p-type region 4 of the parallel pn layer 5 and the interval x2 between the argon introduced regions 16 facing each other in the depth direction in the n-type region 3 of the pn layer 5 are both widened. In particular, the argon introduced regions 14, 16 are arranged for every two or more layers (in this description, for every two layers) in multiple n⁻-type epitaxial growth layers stacked for forming the parallel pn layer 5.

Figure 24:
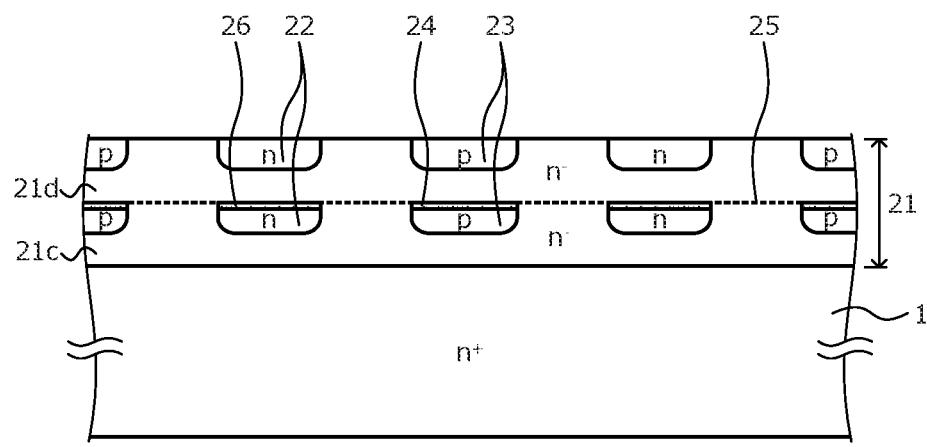
FIGS. 24, 25, and 26 are cross-sectional views of states during manufacturing of the semiconductor device according to the fourth embodiment.
Figure 25:
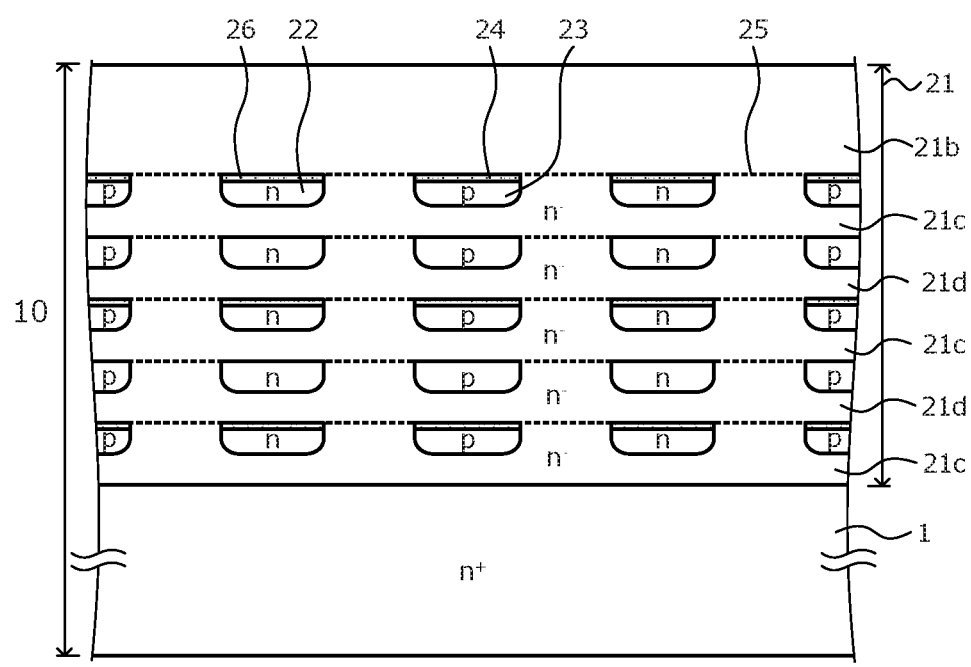
Figure 26:
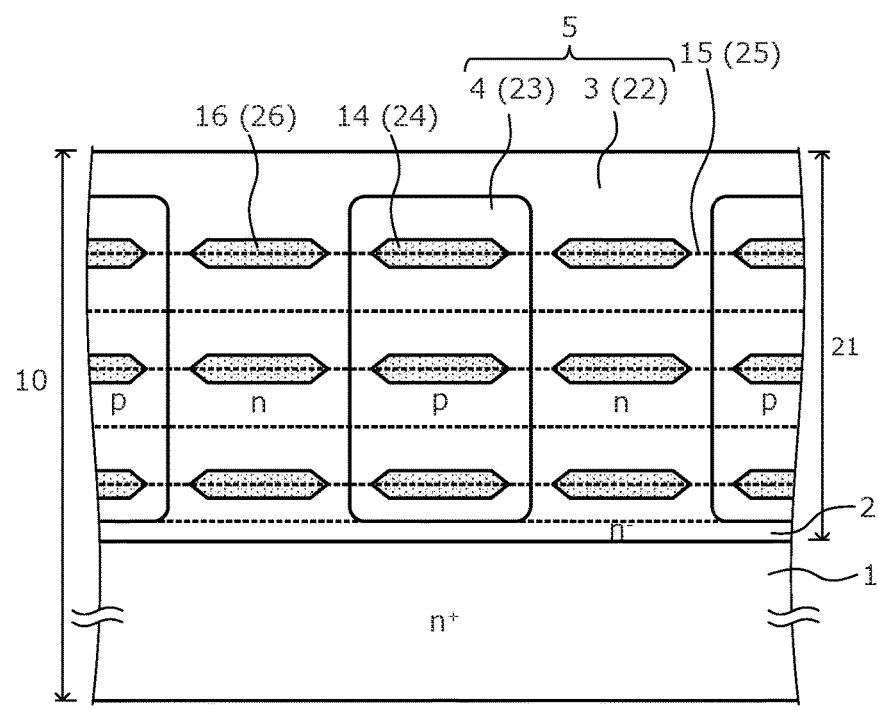

FIGS. 24, 25, and 26 are cross-sectional views of states during manufacturing of the semiconductor device according to the fourth embodiment. The method of manufacturing a semiconductor device according to the fourth embodiment may be implemented by performing the ion implantations 35, 36 of the argon 24, 26 for every two layers in multiple n⁻-type epitaxial growth layers stacked for forming the parallel pn layer 5 in the method of manufacturing a semiconductor device according to the third embodiment. For example, first, similar to the second embodiment, the deposition of the n⁻-type semiconductor layer 21 (the n⁻-type epitaxial growth layer 21c) on the front surface of the n⁺-type semiconductor substrate 1 is followed by the formation of the n-type impurity region 22, the introduction of the argon 26 into the n-type impurity region 22, the formation of the p-type impurity region 23, and the introduction of the argon 24 into the p-type impurity region 23 (see FIGS. 5, 12 to 16).

Subsequently, as depicted in FIG. 24, an n⁻-type epitaxial growth layer 21d is newly deposited as the n⁻-type semiconductor layer 21 on the n⁻-type epitaxial growth layer 21c (i.e., the thickness of the n⁻-type semiconductor layer 21 is increased) to cover the n-type impurity region 22 and the p-type impurity region 23. The formation of the n-type impurity region 22 and the formation of the p-type impurity region 23 are then performed in the n⁻-type epitaxial growth layer 21d newly deposited as the n⁻-type semiconductor layer 21 by using the same method as described above. In this case, the introduction of the argon 26 into the n-type impurity region 22 and the introduction of the argon 24 into the p-type impurity region 23 are not performed.

A step including the formation of the n-type impurity region 22 and the formation of the p-type impurity region 23 as a set in this way is repeatedly performed each time the n⁻-type epitaxial growth layer is deposited as the n⁻-type semiconductor layer 21, including the introduction of the argon 26, 24 into the n-type impurity region 22 and the p-type impurity region 23 every other time. As a result, as depicted in FIG. 25, a repeated alternatingly stacked state is achieved by the n⁻-type epitaxial growth layer 21c with the argon 24, 26 introduced and the n⁻-type epitaxial growth layer 21d without the argon 24, 26 introduced. Therefore, the argon 26, 24 is introduced into the n-type impurity region 22 and the p-type impurity region 23 for every two layers in the n-type epitaxial growth layers stacked as the n⁻-type semiconductor layer 21.

Subsequently, similar to the first embodiment, the n⁻-type epitaxial growth layer 21b serving as the uppermost layer is deposited to increase the thickness of the n⁻-type semiconductor layer 21 so as to form the semiconductor substrate base 10 having a predetermined thickness. The heat treatment (drive) is then performed to form the n-type region 3 of the parallel pn layer 5, the p-type region 4 of the parallel pn layer 5, and the n⁻-type buffer layer 2 similar to the first embodiment. Additionally, as a result of this heat treatment, the argon introduced regions 14, 16 are formed at the positions of the ion implantations 35, 36 of the argon 24, 26 (FIG. 26). Subsequently, similar to the first embodiment, the steps after the formation of the p-type base region 6 are performed sequentially, and the SJ-MOSFET depicted in FIG. 23 is thereby completed.

As described above, according to the fourth embodiment, even when the arrangement of the argon introduced regions is changed, the avalanche resistance may be improved similar to the first to third embodiments.

Figure 27:
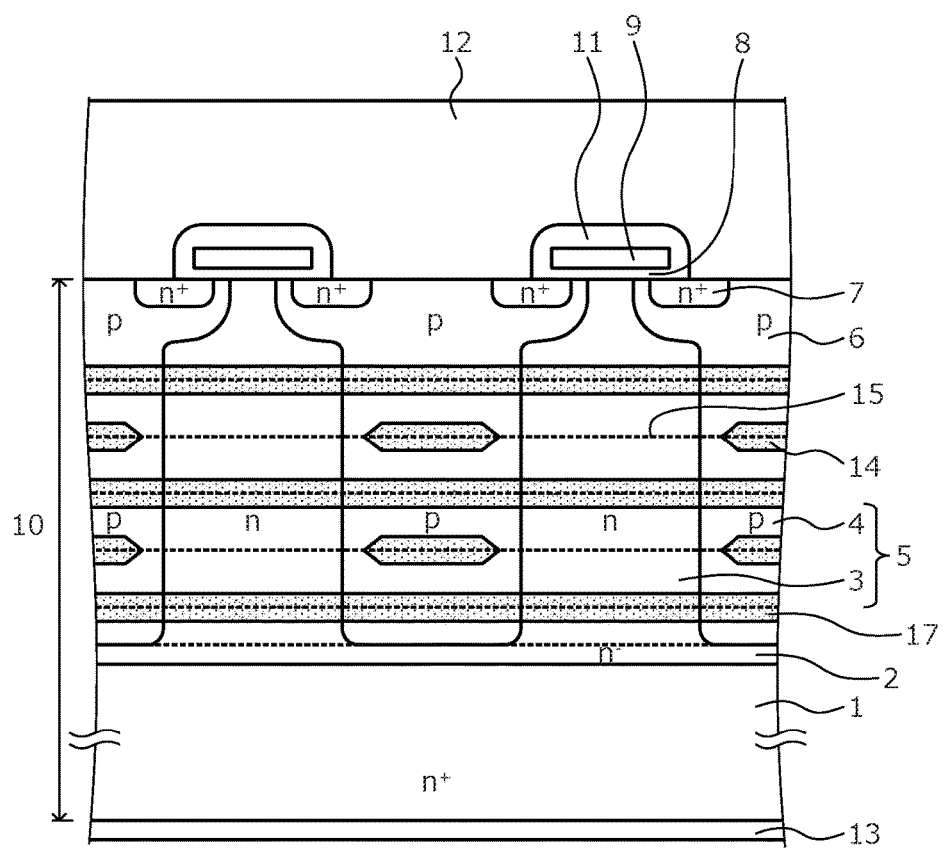
FIG. 27 is a cross-sectional view of a structure of the semiconductor device according to a fifth embodiment.

A structure of the semiconductor device according to a fifth embodiment will be described. FIG. 27 is a cross-sectional view of the structure of the semiconductor device according to the fifth embodiment. The semiconductor device according to the fifth embodiment differs from the semiconductor device according to the first embodiment in that an argon introduced region (hereinafter referred to as an full-surface argon introduced region (first region)) 17 is arranged at a predetermined depth, extending in a direction parallel to the main surface of the semiconductor substrate base 10 at least over the entire surface of the parallel pn layer 5. The full-surface argon introduced region 17 is arranged, for example, for every two or more layers (in this description, for every two layers) in multiple n⁻-type epitaxial growth layers stacked for forming the parallel pn layer 5. The full-surface argon introduced region 17 and the argon introduced region 14 in the p-type region 4 of the parallel pn layer 5 are alternately arranged in the depth direction, repeatedly.

Since the full-surface argon introduced region 17 reaches the pn junction between the n-type region 3 and the p-type region 4 of the parallel pn layer 5, the avalanche resistance may be improved further. On the other hand, since the full-surface argon introduced region 17 reaches the pn junction between the n-type region 3 and the p-type region 4 of the parallel pn layer 5, the ON resistance of the SJ-MOSFET becomes higher or leak current increases as described above. Therefore, the number and the arrangement in the depth direction of the full-surface argon introduced regions 17 may be adjusted such that the ON resistance and the leak current of the SJ-MOSFET fall within allowable ranges. In FIG. 27, the horizontal broken lines 15 indicate boundaries between the multiple n$^-$-type epitaxial growth layers constituting the parallel pn layer 5 (the same applies to FIGS. 32, 33, and 35).

FIGS. 28, 28, 30, 31, and 32 are cross-sectional views of states during manufacturing of the semiconductor device according to the fifth embodiment. The method of manufacturing a semiconductor device according to the fifth embodiment may be implemented by performing ion implantation 37 of argon 27 without using an ion implantation mask, for every two layers in multiple n$^-$-type epitaxial growth layers stacked for forming the parallel pn layer 5 in the method of manufacturing the semiconductor device according to the first embodiment. In this case, the ion implantation 37 of the argon 27 may be performed after the ion implantation 32 for forming the n-type impurity region 22 and the ion implantation 34 for forming the p-type impurity region 23.

Figure 28:
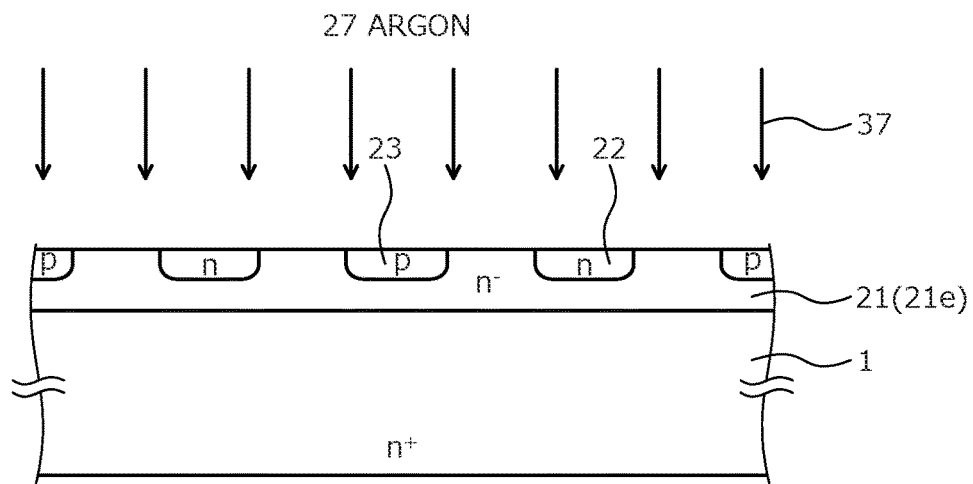
FIGS. 28, 29, 30, 31, and 32 are cross-sectional views of states during manufacturing of the semiconductor device according to the fifth embodiment.

For example, first, after the n$^-$-type semiconductor layer 21 (n$^-$-type epitaxial growth layer: corresponding to reference numeral 21e of FIG. 28) is deposited on the front surface of the n+-type semiconductor substrate 1, the n-type impurity region 22 and the p-type impurity region 23 are each selectively formed in the surface layer of the n$^-$-type semiconductor layer 21 by the same method as the first embodiment (see FIGS. 5 and 6). The second ion implantation mask 33 is then removed. As depicted in FIG. 28, the ion implantation 37 of the argon 27 is then performed into the entire front surface of the n$^-$-type epitaxial growth layer 21e.

Figure 29:
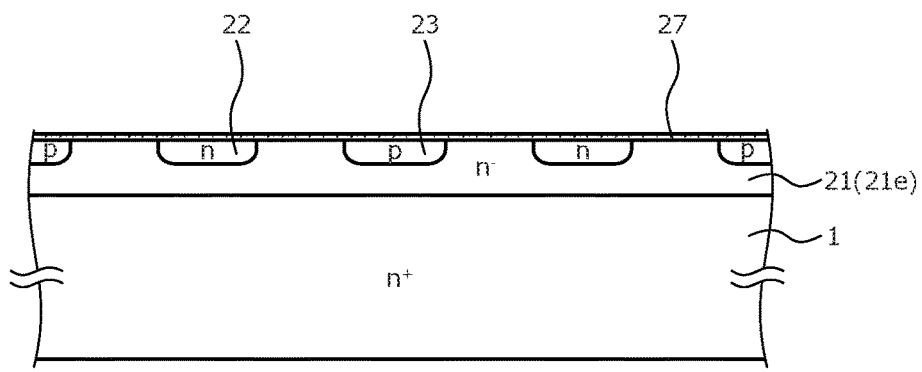
Figure 30:
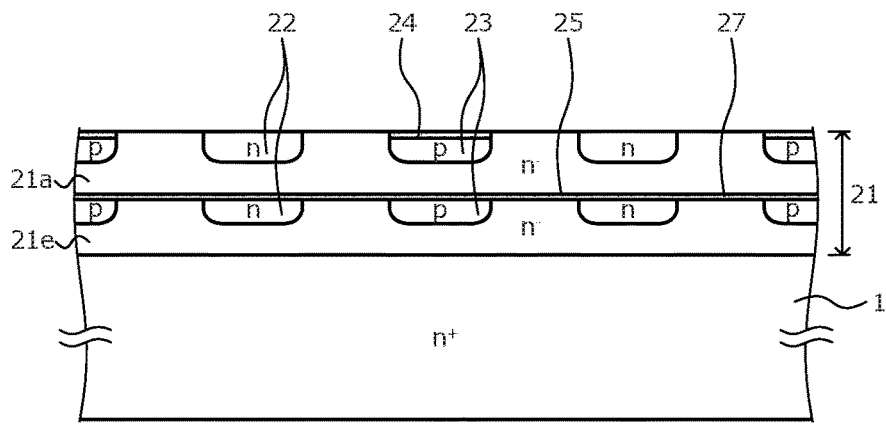

As a result, as depicted in FIG. 29, the argon 27 is introduced into the entire front surface of the n$^-$-type epitaxial growth layer 21e. The ion implantation 37 of the argon 27 may be performed only in a portion corresponding to the formation region of the parallel pn layer 5 by using an ion implantation mask (not depicted). As depicted in FIG. 30, after the n$^-$-type epitaxial growth layer 21a is newly deposited as the n$^-$-type semiconductor layer 21 on the n$^-$-type epitaxial growth layer 21e, the formation of the n-type impurity region 22, the formation of the p-type impurity region 23, and the introduction of the argon 24 into the p-type impurity region 23 are performed similar to the first embodiment. In this case, the argon 26 is not introduced into the n-type impurity region 22. In FIG. 30, a solid line 25 corresponding to the upper surface of the introduction region of the argon 27 indicates a boundary between multiple n$^-$-type epitaxial growth layers constituting the n$^-$-type semiconductor layer 21 (similarly in FIG. 37).

Figure 31:
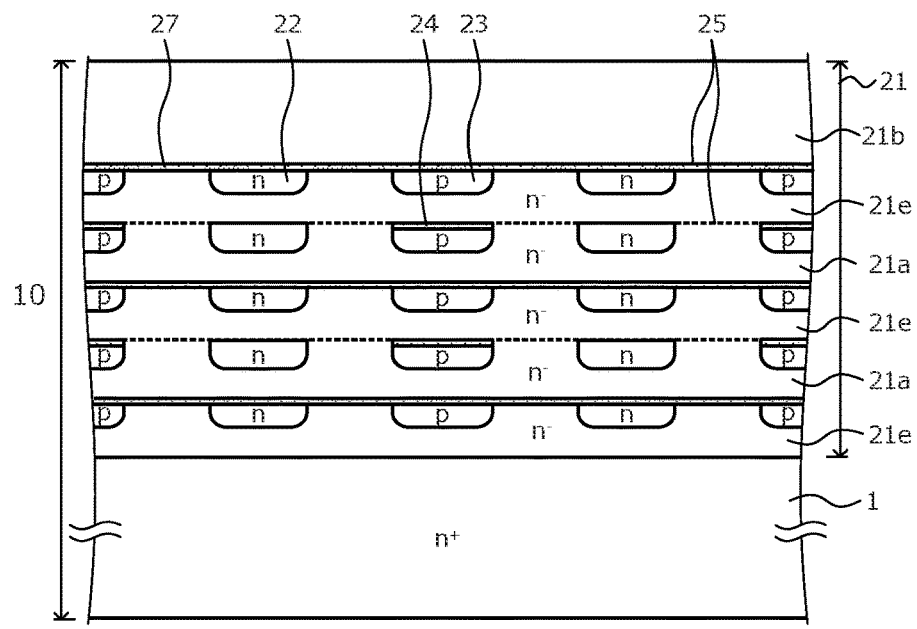

A step including the formation of the n-type impurity region 22, the formation of the p-type impurity region 23, and the introduction of argon as a set in this way is repeatedly performed each time the n$^-$-type epitaxial growth layer is deposited as the n$^-$-type semiconductor layer 21. In this case, for the introduction of argon, the introduction of the argon 27 into the entire surface and the introduction of the argon 24 into the p-type impurity region 23 are alternately performed each time the n$^-$-type epitaxial growth layer is deposited as the n$^-$-type semiconductor layer 21. As a result, as depicted in FIG. 31, a repeated alternatingly stacked state is achieved by the n$^-$-type epitaxial growth layer 21e with the argon 27 introduced into the entire surface and the n$^-$-type epitaxial growth layer 21a with the argon 24 introduced only in the p-type impurity region 23. In FIG. 31, a solid line denoted by reference numeral 25 (the upper surface of the introduction region of the argon 27) and a horizontal broken line indicate boundaries between multiple n$^-$-type epitaxial growth layers constituting the n$^-$-type semiconductor layer 21 (similarly in FIG. 34).

Figure 32:
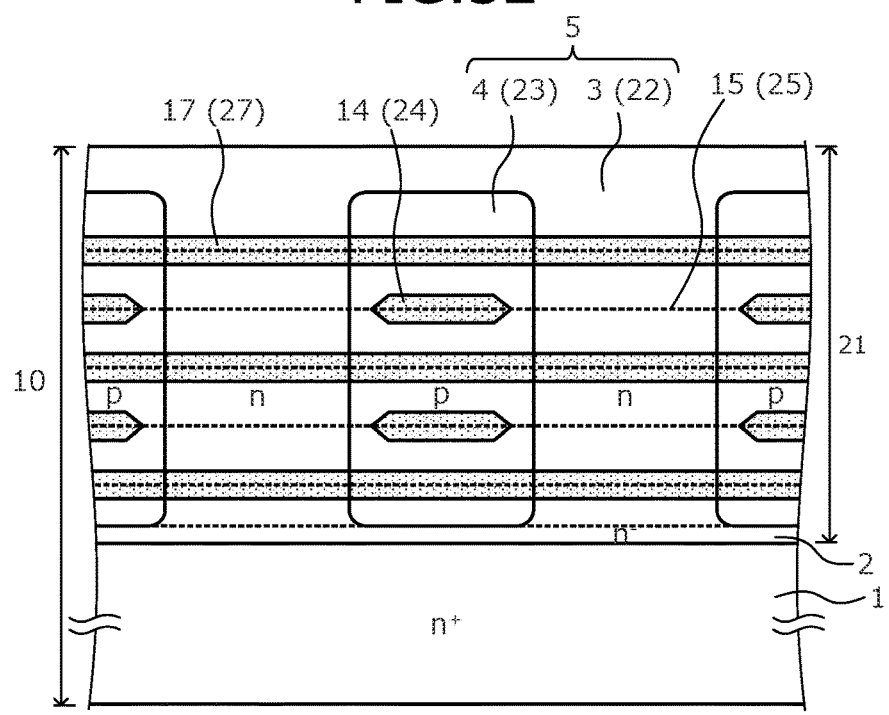

Subsequently, similar to the first embodiment, the n$^-$-type epitaxial growth layer 21b forming the uppermost layer is deposited to increase the thickness of the n$^-$-type semiconductor layer 21 so as to form the semiconductor substrate base 10 having a predetermined thickness. The heat treatment (drive) is then performed to form the n-type region 3 of the parallel pn layer 5, the p-type region 4 of the parallel pn layer 5, and the n$^-$-type buffer layer 2 similar to the first embodiment. Additionally, as a result of this heat treatment, the argon introduced regions 14 and the full-surface argon introduced regions 17 are respectively formed at the positions of the ion implantations 35, 37 of the argon 24, 27 (FIG. 32). Subsequently, similar to the first embodiment, the steps after the formation of the p-type base region 6 are performed sequentially, and the SJ-MOSFET depicted in FIG. 27 is thereby completed.

As described above, according to the fifth embodiment, even when the arrangement of the argon introduced regions is changed, the avalanche resistance may be improved similar to the first to fourth embodiments. According to the fifth embodiment, since the full-surface argon introduced region is arranged to reach the pn junction between the n-type region and the p-type region of the parallel pn layer, the avalanche resistance may be improved further.

Figure 33:
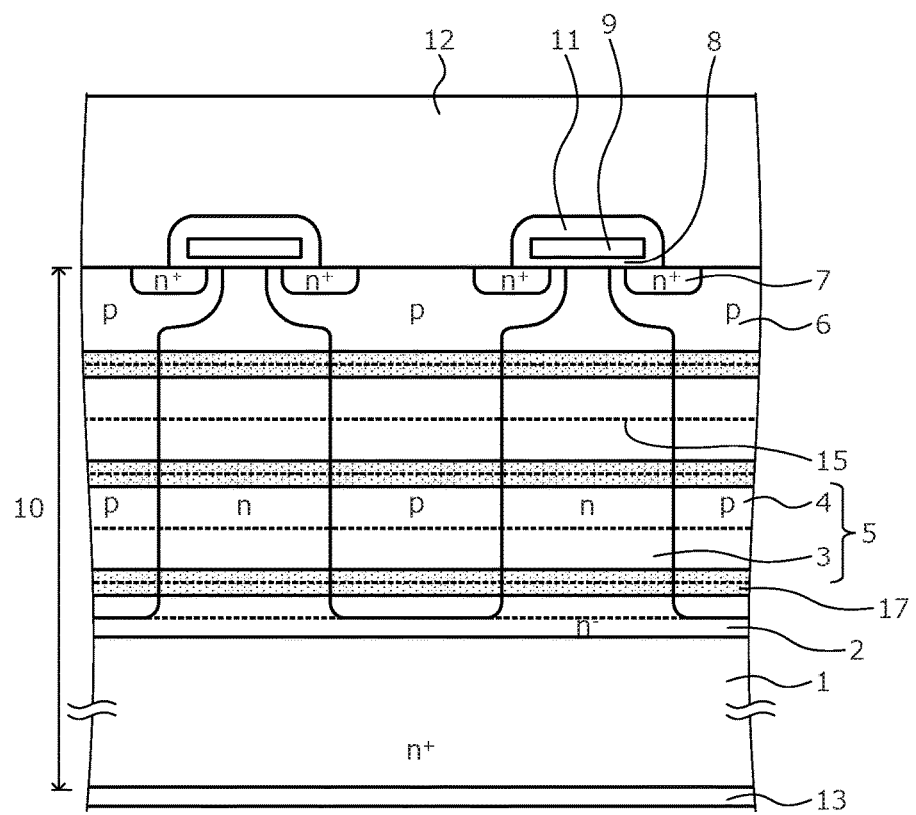
FIG. 33 is a cross-sectional view of a structure of the semiconductor device according to a sixth embodiment.

A structure of the semiconductor device according to a sixth embodiment will be described. FIG. 33 is a cross-sectional view of the structure of the semiconductor device according to the sixth embodiment. The semiconductor device according to the sixth embodiment differs from the semiconductor device according to the fifth embodiment in that no argon introduced region is arranged in the p-type region 4 of the parallel pn layer 5. Therefore, the argon introduced regions in the parallel pn layer 5 are only the full-surface argon introduced regions 17, and the full-surface argon introduced regions 17 are arranged for every two or more layers (in this description, for every two layers) in multiple n$^-$-type epitaxial growth layers stacked for forming the parallel pn layer 5. The horizontal broken lines 15 depicted in the full-surface argon introduced regions 17 indicate boundaries between multiple n$^-$-type epitaxial growth layers and indicate argon ion implantation positions (ion implantation planes) of the argon ion implantation performed for forming the full-surface argon introduced regions 17 (similarly in FIGS. 35, 36, and 38).

Figure 34:
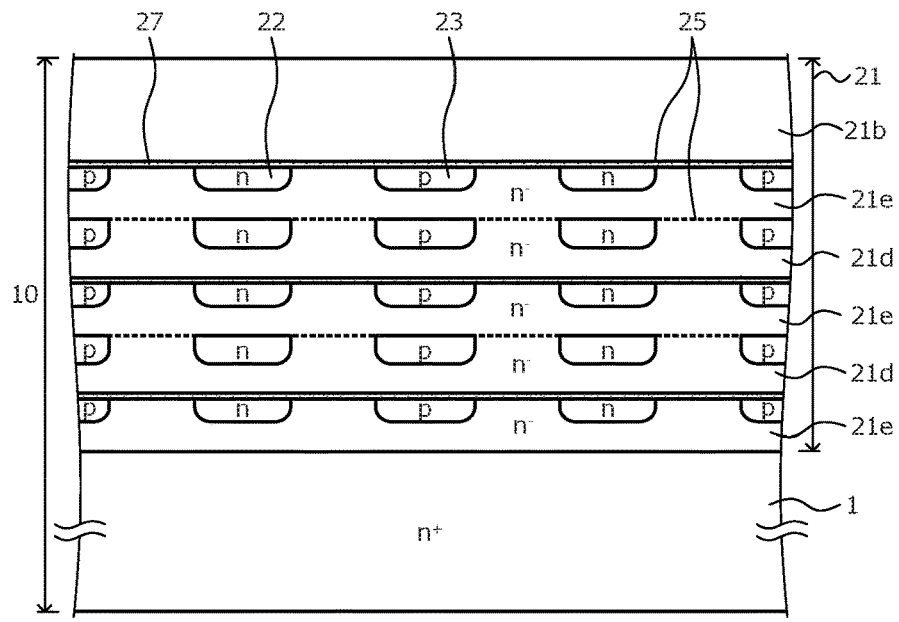
FIGS. 34 and 35 are cross-sectional views of states during manufacturing of the semiconductor device according to the sixth embodiment.
Figure 35:
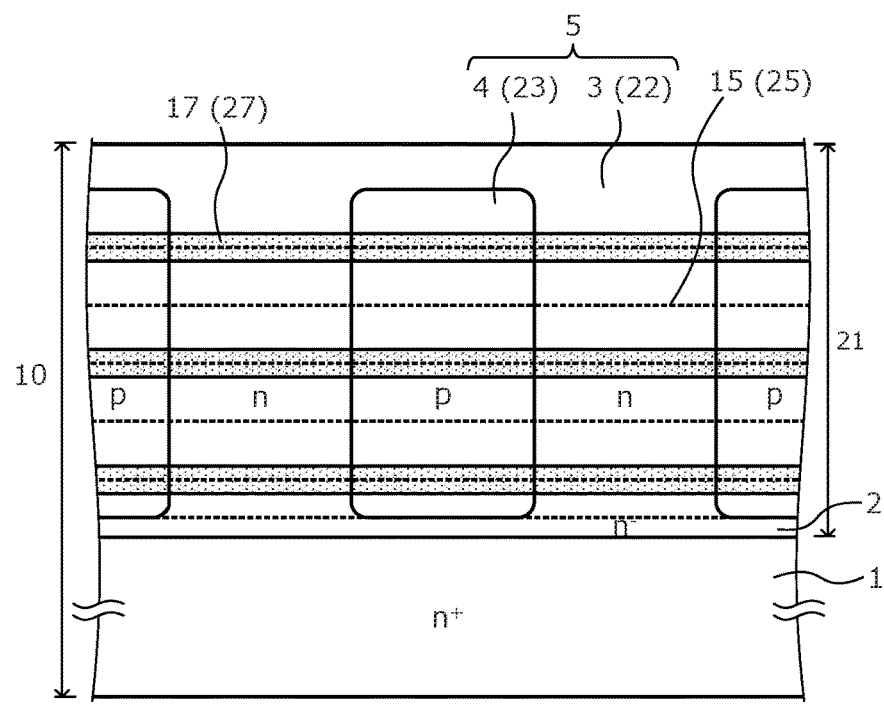

FIGS. 34 and 35 are cross-sectional views of states during manufacturing of the semiconductor device according to the sixth embodiment. The method of manufacturing the semiconductor device according to the sixth embodiment may be implemented by eliminating the ion implantation 35 of the argon 24 into the p-type impurity region 23 in the method of manufacturing the semiconductor device according to the fifth embodiment. For example, first, similar to the fifth embodiment, the deposition of the n⁻-type semiconductor layer 21 (the n⁻-type epitaxial growth layer 21e) on the front surface of the n⁺-type semiconductor substrate 1 is followed by the formation of the n-type impurity region 22, the formation of the p-type impurity region 23, and the introduction of the argon 27 into the entire surface (see FIGS. 28 and 29). Subsequently, after the n⁻-type epitaxial growth layer 21d is newly deposited as the n⁻-type semiconductor layer 21 on the n⁻-type epitaxial growth layer 21e, the formation of the n-type impurity region 22 and the formation of the p-type impurity region 23 are performed similar to the first embodiment.

A step including the formation of the n-type impurity region 22 and the formation of the p-type impurity region 23 as a set in this way is repeatedly performed each time the n⁻-type epitaxial growth layer is deposited as the n⁻-type semiconductor layer 21, including the introduction of the argon 27 into the entire surface every other time. As a result, as depicted in FIG. 34, a repeated alternatingly stacked state is achieved by the n⁻-type epitaxial growth layer 21e with the argon 27 introduced into the entire surface and the n⁻-type epitaxial growth layer 21d without the argon 27 introduced. Therefore, the argon 27 is introduced to the entire surface for every two layers in the n⁻-type epitaxial growth layers stacked as the n⁻-type semiconductor layer 21.

Subsequently, similar to the first embodiment, the n⁻-type epitaxial growth layer 21b serving as the uppermost layer is deposited to increase the thickness of the n⁻-type semiconductor layer 21 so as to form the semiconductor substrate base 10 having a predetermined thickness. The heat treatment (drive) is then performed to form the n-type region 3 of the parallel pn layer 5, the p-type region 4 of the parallel pn layer 5, and the n⁻-type buffer layer 2 similar to the first embodiment. Additionally, as a result of this heat treatment, the full-surface argon introduced regions 17 are formed at the positions of the ion implantations 37 of the argon 27 (FIG. 35). Subsequently, similar to the first embodiment, the steps after the formation of the p-type base region 6 are performed sequentially, and the SJ-MOSFET depicted in FIG. 33 is thereby completed.

As described above, according to the sixth embodiment, even when the arrangement of the argon introduced regions is changed, the avalanche resistance may be improved similar to the first to fifth embodiments.

Figure 36:
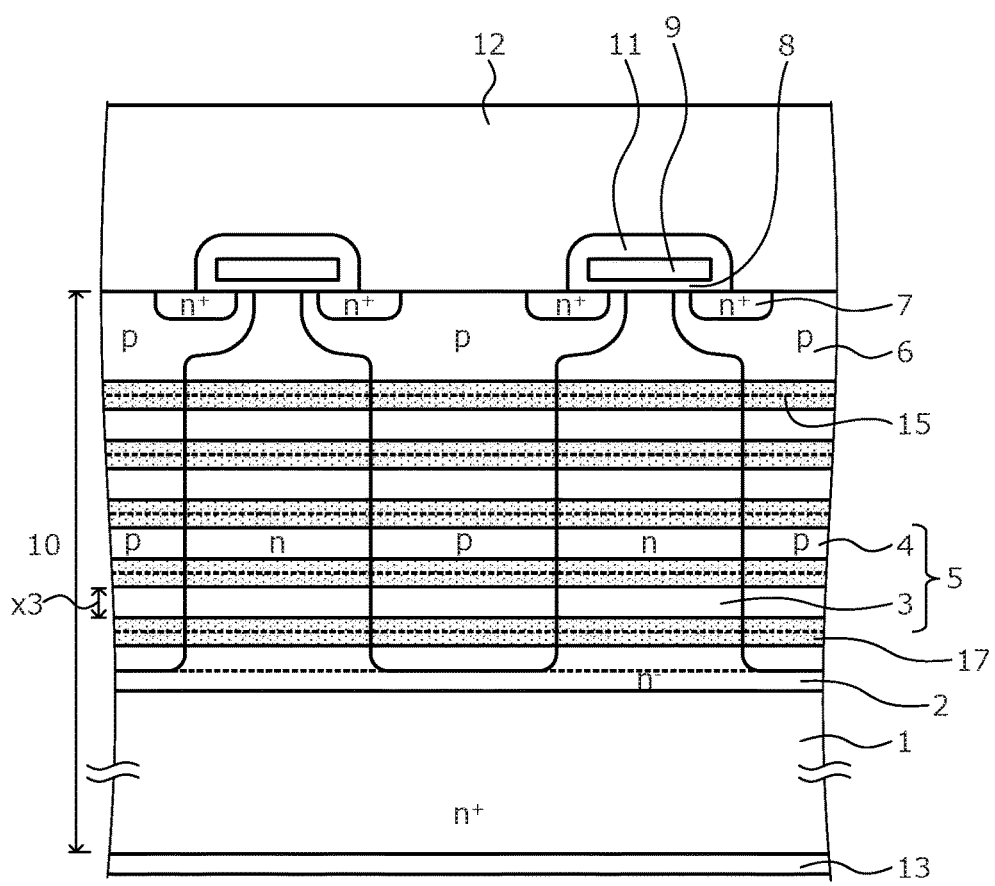
FIG. 36 is a cross-sectional view of a structure of the semiconductor device according to a seventh embodiment.

A structure of the semiconductor device according to a seventh embodiment will be described. FIG. 36 is a cross-sectional view of the structure of the semiconductor device according to the seventh embodiment. The semiconductor device according to the seventh embodiment differs from the semiconductor device according to the sixth embodiment in that an interval x3 is reduced between the full-surface argon introduced regions 17 facing each other in the depth direction.

For example, the multiple full-surface argon introduced regions 17 are respectively formed by ion implantation of argon into the entire surfaces of respective n⁻-type epitaxial growth layers stacked for forming the parallel pn layer 5, and are arranged away from each other at the interval x3 corresponding to the thickness of each of the n⁻-type epitaxial growth layers. The intervals x3 between the full-surface argon introduced regions 17 facing each other in the depth direction may be widened to such an extent that the ON resistance of the SJ-MOSFET can be kept within an allowable range. In FIG. 36, the horizontal broken lines 15 depicted in the full-surface argon introduced regions 17 indicate boundaries between the multiple n⁻-type epitaxial growth layers constituting the parallel pn layer 5 (similarly in FIG. 38).

Figure 37:
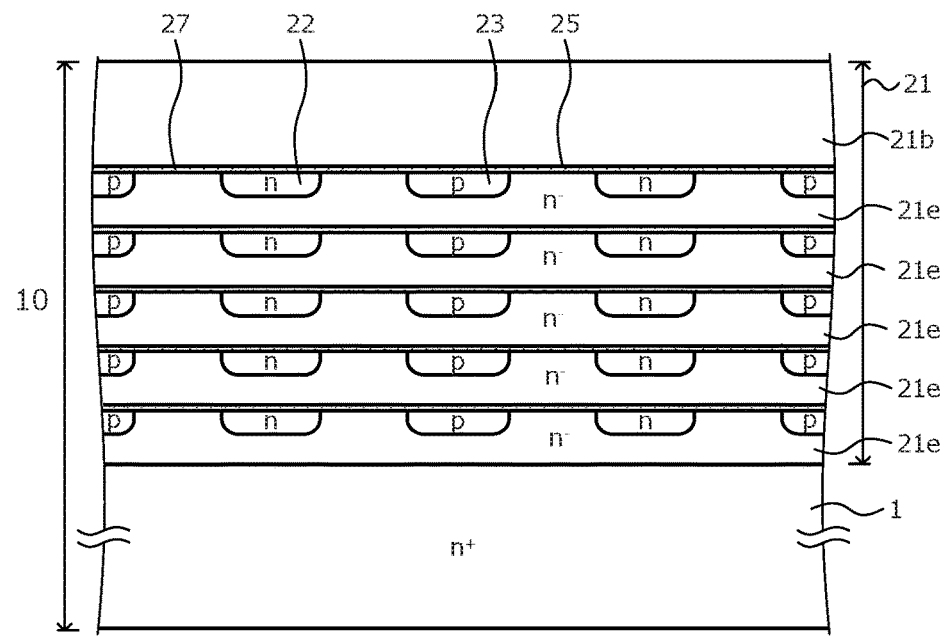
FIGS. 37 and 38 are cross-sectional views of states during manufacturing of the semiconductor device according to the seventh embodiment.
Figure 38:
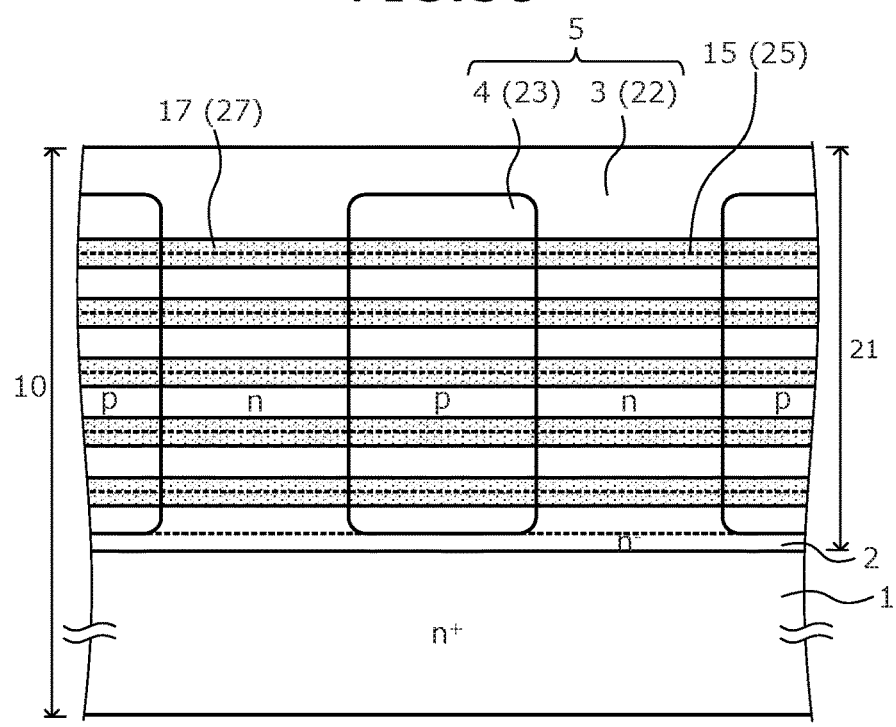

FIGS. 37 and 38 are cross-sectional views of states during manufacturing of the semiconductor device according to the seventh embodiment. The method of manufacturing a semiconductor device according to the seventh embodiment may be implemented by repeatedly performing a step including the formation of the n-type impurity region 22, the formation of the p-type impurity region 23, and the introduction of the argon 27 into the entire surface as a set each time the n⁻-type epitaxial growth layer is deposited as the n⁻-type semiconductor layer 21 in the method of manufacturing a semiconductor device according to the sixth embodiment. Therefore, first, the multiple n⁻-type epitaxial growth layers 21e are stacked, with the n-type impurity regions 22 and the p-type impurity regions 23 formed therein in the same planar layout and with the argon 27 introduced into the entire surfaces, on the front side of the n⁺-type semiconductor substrate 1 (FIG. 37).

Subsequently, similar to the first embodiment, the n⁻-type epitaxial growth layer 21b forming the uppermost layer is deposited to increase the thickness of the n⁻-type semiconductor layer 21 so as to form the semiconductor substrate base 10 having a predetermined thickness. The heat treatment (drive) is then performed to form the n-type region 3 of the parallel pn layer 5, the p-type region 4 of the parallel pn layer 5, and the n⁻-type buffer layer 2 similar to the first embodiment. Additionally, as a result of this heat treatment, the full-surface argon introduced regions 17 are formed at the positions of the ion implantations 37 of the argon 27 (FIG. 38). Subsequently, similar to the first embodiment, the steps after the formation of the p-type base region 6 are performed sequentially, and the SJ-MOSFET depicted in FIG. 36 is thereby completed.

As described above, according to the seventh embodiment, even when the arrangement of the argon introduced regions is changed, the avalanche resistance may be improved similar to the first to sixth embodiments. Additionally, according to the seventh embodiment, the percentage of the argon introduced regions increases in the parallel pn layer and therefore, the avalanche resistance may be improved further.

Figure 39:
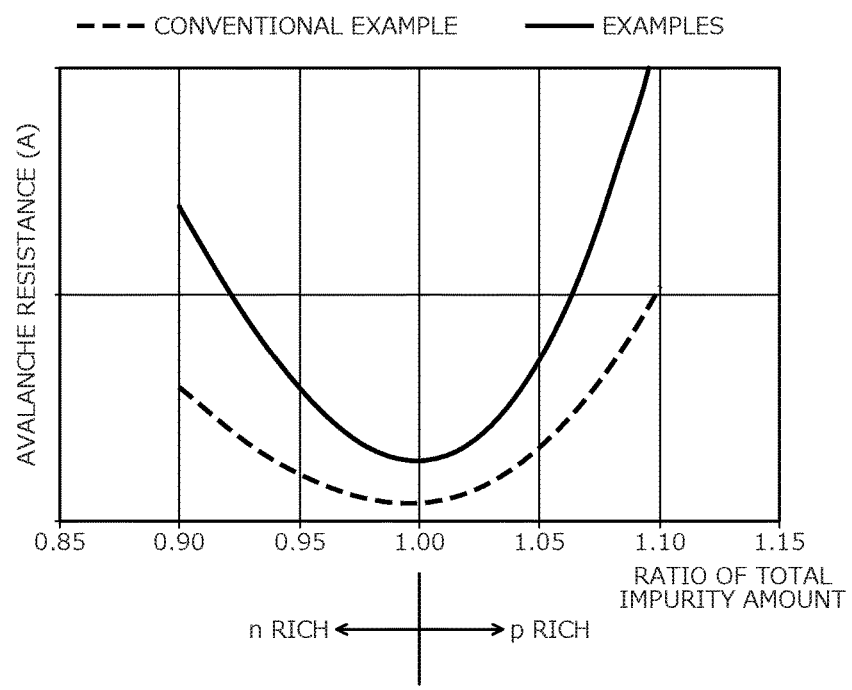
FIG. 39 is a characteristics diagram of avalanche resistance of semiconductor devices according to examples.

The avalanche resistance of semiconductor devices according to examples was verified. FIG. 39 is a characteristics diagram of the avalanche resistance of the semiconductor devices according to the examples. First, according to the method of manufacturing the semiconductor device according to the seventh embodiment described above, multiple SJ-MOSFETs (hereinafter referred to as examples) having the multiple argon introduced regions 14 arranged in the p-type region 4 of the parallel pn layer 5 were produced. The multiple examples differ from each other in the ratio between the total impurity amount of the n-type impurity in the n-type region 3 and the total impurity amount of the p-type impurity in the p-type region 4 of the parallel pn layer 5. The measurement results of avalanche resistance for these examples are depicted in FIG. 39.

Figure 40:
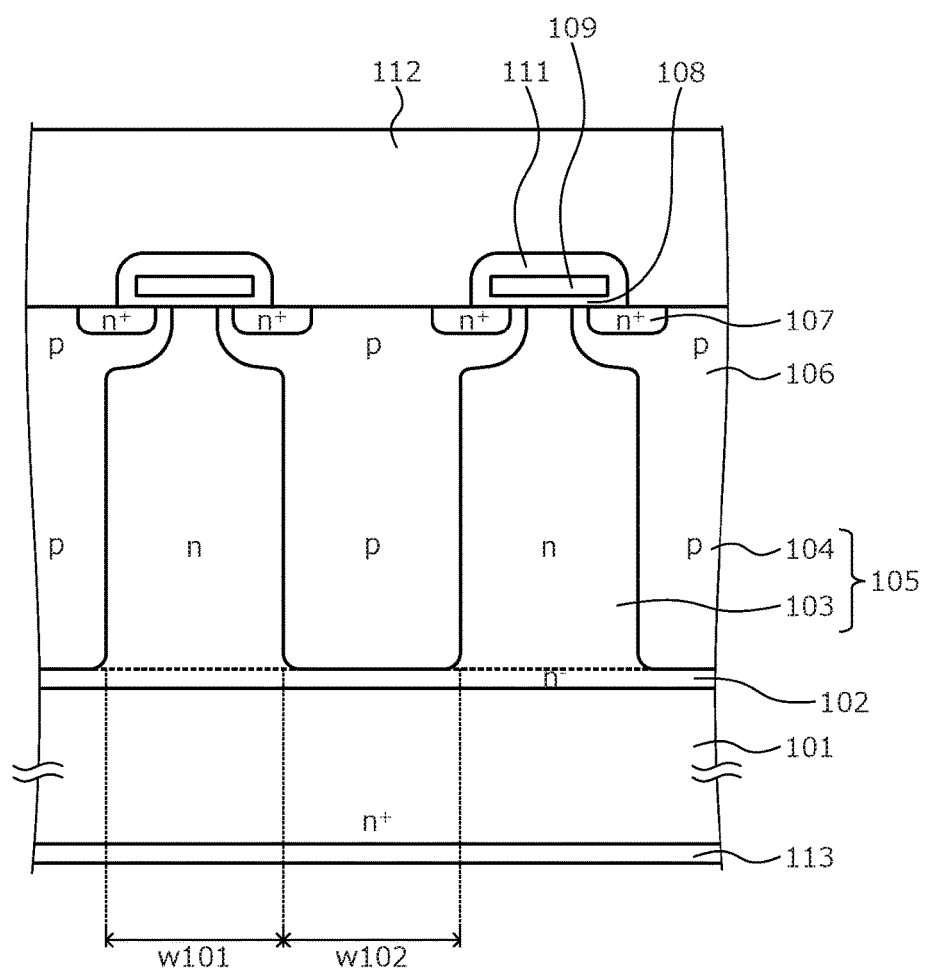
FIG. 40 is a cross-sectional view of a structure of a conventional superjunction semiconductor device.

FIG. 39 also depicts the avalanche resistance of conventional SJ-MOSFETs without an argon introduced region (hereinafter referred to as conventional examples: see FIG. 40). The configuration of the conventional examples is the same as the examples except that no argon introduced region is provided. The horizontal axis in FIG. 39 represents the ratio of the total impurity amount between the n-type region and the p-type region of the parallel pn layer (=the total impurity amount of the p-type region/the total impurity amount of the n-type region). When the ratio of the total impurity amount=1.00, the total impurity amounts of the n-type region and the p-type region of the parallel pn layer are the same. When the ratio of the total impurity amount exceeds 1.00, the parallel pn layer is p-rich, and when the ratio of the total impurity amount is less than 1.00, the parallel pn layer is n-rich. The vertical axis in FIG. 39 represents the avalanche resistance of the examples and the conventional examples.

From the result depicted in FIG. 39, it was confirmed that the avalanche resistance of the examples is the lowest when the total impurity amounts of the n-type region 3 and the p-type region 4 of the parallel pn layer 5 are substantially the same similar to the conventional examples. It was also confirmed that the avalanche resistance of the examples may be improved when the parallel pn layer 5 is made p-rich as compared to when the parallel pn layer 5 is made n-rich as is the case with the conventional examples. It was also confirmed that in the examples, the avalanche resistance may be improved more than the conventional examples regardless of the ratio of the total impurity amount between the n-type region and the p-type region of the parallel pn layer. Although not depicted, the present inventor has confirmed that the same effects as the examples are obtained even when the argon introduced regions 14, 16 and the full-surface argon introduced regions 17 are provided in various arrangements in the parallel pn layer 5 as in the second to seventh embodiments described above.

The present invention in the above description is not limited to the embodiments described above and may be modified variously without departing from the spirit of the present invention. For example, the dimensions, impurity concentrations, etc. of the parts are variously set according to required specifications, etc. Additionally, the number and the arrangement in the depth direction of the argon introduced regions or the full-surface argon introduced regions facing each other in the depth direction may be changed variously according to a design condition and avalanche occurrence position. Although the embodiments are described by taking the SJ-MOSFETs as examples, the present invention is also applicable to other semiconductor devices including parallel pn layers, for example, an SJ-insulated gate bipolar transistor (IGBT), an SJ-MOSFET using silicon carbide (SiC) as a semiconductor material, etc. The present invention may be implemented in the same way even when the conductivity types (n-type, p-type) are inverted.

The embodiments described above have been described as the embodiments including the MOS gate structure of the planar gate structure; however, the MOS gate structure may have a trench gate structure including a trench in the surface layer of the p-type region 4 of the parallel pn layer of the semiconductor substrate base 10 with a gate electrode embedded in the trench via a gate insulating film.

However, as described above, when the impurity concentration in the depth direction is made substantially uniform between the n-type region 103 and the p-type region 104 in the conventional superjunction semiconductor device (see FIG. 40), the operating resistance when avalanche breakdown occurs is a negative resistance and it is therefore difficult to ensure a sufficient avalanche resistance. In other words, it is difficult to improve the avalanche resistance in a configuration ensuring a predetermined breakdown voltage by making the impurity concentration in the depth direction substantially uniform between the n-type region 103 and the p-type region 04.

The semiconductor device and the method of manufacturing a semiconductor device according to the present invention produces an effect in that the avalanche resistance may be improved by introducing a group 18 element into a parallel pn layer while breakdown voltage is maintained without changing the total impurity amounts of an n-type region and a p-type region of the parallel pn layer.

As described above, the semiconductor device and the method of manufacturing a semiconductor device according to the present invention are useful for superjunction semiconductor devices and particularly suitable for SJ-MOSFETs.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device having
   a semiconductor layer of a first conductivity type, and
   a parallel pn layer formed on the semiconductor layer, the parallel pn layer having a plurality of first semiconductor regions of the first conductivity type and a plurality of second semiconductor regions of a second conductivity type, the first and second semiconductor regions being alternately arranged in a direction parallel to a surface of the semiconductor layer,
the method comprising:
   providing the semiconductor layer; and
   repeatedly executing a set of processes including:
   a depositing process of forming an epitaxial growth layer that is of the first conductivity type or that is non-doped, the epitaxial growth layer having an impurity concentration lower than that of the semiconductor layer;
   a first implanting process of ion implanting a first-conductivity-type impurity into the formed epitaxial growth layer;
   a second implanting process of selectively ion implanting a second-conductivity-type impurity into the formed epitaxial growth layer; and
   a third implanting process of ion implanting a group 18 element into the formed epitaxial growth layer,
to thereby stack on the semiconductor layer the epitaxial growth layers to form the parallel pn layer.

2. The method according to claim 1, wherein
   the third implanting process includes ion implanting the group 18 element into the formed epitaxial growth layer only at a position at which the second-conductivity-type impurity is ion implanted.

3. The method according to claim 2, wherein
   in each repetition, the third implanting process is executed after the second implanting process.

4. The method according to claim 1, wherein
   the second implanting process includes:
      forming on a surface of the formed epitaxial growth layer, a first mask having a plurality of openings, each corresponding to a formation region of one of the second semiconductor regions, and
      ion implanting the second-conductivity-type impurity through the first mask; and
   the third implanting process includes ion implanting the group 18 element through the first mask.

5. The method according to claim 1, further comprising a fourth implanting process of ion implanting the group 18 element into the epitaxial growth layer at a position at which the first-conductivity-type impurity is ion implanted, wherein
the fourth implanting process is executed each time the set of processes is repeated, or is repeated at an interval of a predetermined number of times of repetition of the set of processes.

6. The method according to claim 5, wherein
the first implanting process includes:
   forming on a surface of the formed epitaxial growth layer, a second mask having a plurality of openings, each corresponding to a formation region of one of the first semiconductor regions, and
   ion implanting the first-conductivity-type impurity through the second mask, and
the fourth implanting process includes ion implanting the group 18 element through the second mask.

7. The method according claim 5, wherein
in each repetition, the fourth implanting process is executed after the first implanting process.

8. The method according to claim 1, wherein
the third implanting process includes, after each predetermined number of times of repetition of the set of processes, ion implanting the group 18 element into the epitaxial growth layer only at a position at which the second-conductivity-type impurity is ion implanted.

9. The method according to claim 1, wherein
in each repetition, the third implanting process is executed after the first implanting process and the second implanting process.

10. The method according to claim 1, comprising
forming, on the semiconductor layer before repeatedly executing the set of processes, a low-concentration semiconductor layer of the first conductivity type having an impurity concentration that is lower than an impurity concentration of the first semiconductor regions.

11. The method according to claim 1, wherein
the second-conductivity-type impurity has a diffusion coefficient larger than a diffusion coefficient of the group 18 element.

12. The method according to claim 1, wherein
the first-conductivity-type impurity has a diffusion coefficient larger than a diffusion coefficient of the group 18 element.

13. The method according to claim 1, wherein
the group 18 element is argon.

14. A method of manufacturing a semiconductor device having
a semiconductor layer of a first conductivity type, and
a parallel pn layer formed on the semiconductor layer, the parallel pn layer having a plurality of first semiconductor regions of the first conductivity type and a plurality of second semiconductor regions of a second conductivity type, the first and second semiconductor regions being alternately arranged in a direction parallel to a surface of the semiconductor layer,
the method comprising:
providing the semiconductor layer; and
repeatedly executing a set of processes including:
a depositing process of forming an epitaxial growth layer that is of the first conductivity type or that is non-doped, the epitaxial growth layer having an impurity concentration lower than that of the semiconductor layer;
a first implanting process of ion implanting a first-conductivity-type impurity into the formed epitaxial growth layer;
a second implanting process of selectively ion implanting a second-conductivity-type impurity into the formed epitaxial growth layer; and
a third implanting process of ion implanting a group 18 element into the epitaxial growth layer, the third implanting process being so arranged as to be executed only once every predetermined number of times of repetition of the depositing and first and second implanting processes,
to thereby stack on the semiconductor layer the epitaxial growth layers to form the parallel pn layer.

15. The method according to claim 14, wherein
the third implanting process includes ion implanting the group 18 element into the formed epitaxial growth layer only at a first position at which the second-conductivity-type impurity is ion implanted, and
the set of processes further includes a fourth implanting process of ion implanting the group 18 element into the formed epitaxial growth layer only at a second position at which the first-conductivity-type impurity is ion implanted, the fourth implanting process being so arranged as to be executed only once every second predetermined number of times of repetition of the depositing and first and second implanting processes.

16. A method of manufacturing a semiconductor device having
a semiconductor layer of a first conductivity type, and
a parallel pn layer formed on the semiconductor layer, the parallel pn layer having a plurality of first semiconductor regions of the first conductivity type and a plurality of second semiconductor regions of a second conductivity type, the first and second semiconductor regions being alternately arranged in a direction parallel to a surface of the semiconductor layer,
the method comprising:
providing the semiconductor layer; and
repeatedly executing a set of processes including:
a depositing process of forming an epitaxial growth layer of the first conductivity type having an impurity concentration that is lower than an impurity concentration of the semiconductor layer;
one implanting process of selectively ion implanting a second-conductivity-type impurity into the formed epitaxial growth layer; and
another implanting process of ion implanting a group 18 element into the formed epitaxial growth layer,
so as to stack on the semiconductor layer the epitaxial growth layers to form the parallel pn layer.

17. The method according to claim 16, wherein
the another implanting process includes ion implanting the group 18 element into the epitaxial growth layer only at a position at which the second-conductivity-type impurity is ion implanted.

18. The method according to claim 17, wherein
the one implanting process includes:
   forming on a surface of the epitaxial growth layer, a first mask having a plurality of openings, each corresponding to a formation region of one of the second semiconductor regions, and
   ion implanting the second-conductivity-type impurity through the first mask, and
the another implanting process includes ion implanting the group 18 element through the first mask.

19. The method according to claim 17, further comprising
a further implanting process of ion implanting the group 18 element into the epitaxial growth layer at a second position different from the position at which the second-conductivity-type impurity is ion implanted, wherein
the further implanting process is executed each time the set of processes is repeated or once every predetermined number of times of repetition of the set of processes.

20. The method according to claim 16, wherein
the another implanting process includes ion implanting once every predetermined number of times of repetition of the depositing and one implanting processes, the group 18 element into the epitaxial growth layer only at a position at which the second-conductivity-type impurity is ion implanted.

* * * * *